(12) United States Patent
Ito et al.

(10) Patent No.: US 7,482,701 B2
(45) Date of Patent: Jan. 27, 2009

(54) PRODUCTION EQUIPMENT OF RESIN MOLDING SEMICONDUCTOR DEVICE, METHOD OF MANUFACTURING RESIN MOLDING SEMICONDUCTOR DEVICE, AND RESIN MOLDING SEMICONDUCTOR DEVICE

(75) Inventors: Tetsuo Ito, Okaka (JP); Takayuki Yoshida, Shiga (JP); Toshiyuki Fukuda, Kyoto (JP); Takao Ochi, Shiga (JP)

(73) Assignee: Panasonic Corporation, Osaka (JP)

( * ) Notice: Subject to any disclaimer, the term of this patent is extended or adjusted under 35 U.S.C. 154(b) by 53 days.

(21) Appl. No.: 11/812,154

(22) Filed: Jun. 15, 2007

(65) Prior Publication Data

US 2008/0036069 A1 Feb. 14, 2008

(30) Foreign Application Priority Data

Aug. 11, 2006 (JP) .............................. 2006-219069

(51) Int. Cl.
*H01L 23/28* (2006.01)

(52) U.S. Cl. ...................... 257/787; 257/724; 438/127; 438/110

(58) Field of Classification Search ................. 257/787, 257/723, 724; 438/107, 110, 124, 127
See application file for complete search history.

(56) References Cited

U.S. PATENT DOCUMENTS

| 2005/0127535 A1* | 6/2005 | Takahashi et al. ............ 257/787 |
| 2005/0133895 A1* | 6/2005 | Ujiie et al. ................... 257/678 |
| 2006/0188595 A1* | 8/2006 | Furukawa et al. ......... 425/129.1 |
| 2007/0090565 A1* | 4/2007 | Ochi ..................... 264/272.11 |
| 2008/0014482 A1* | 1/2008 | Yamamiya ................... 429/19 |
| 2008/0194060 A1* | 8/2008 | Shimanuki ................. 438/114 |

FOREIGN PATENT DOCUMENTS

| JP | 2000-124239 | 4/2000 |
| JP | 2005-347514 | 12/2005 |

* cited by examiner

*Primary Examiner*—S. V Clark
(74) *Attorney, Agent, or Firm*—Steptoe & Johnson LLP

(57) ABSTRACT

A production equipment includes a substrate 2 placed inside and having a plurality of semiconductor elements 3 mounted thereon, and a resin molding mold 20 having a cavity 21. The mold 20 has resin injection ports 29*a* and air release ports 30*a*. Each of the resin injection ports 29*a* is formed in a top surface portion of the cavity in the mold in association with the corresponding semiconductor element 3. Each of the air release ports 30*a* is formed around each of the resin injection ports 29*a*.

16 Claims, 29 Drawing Sheets

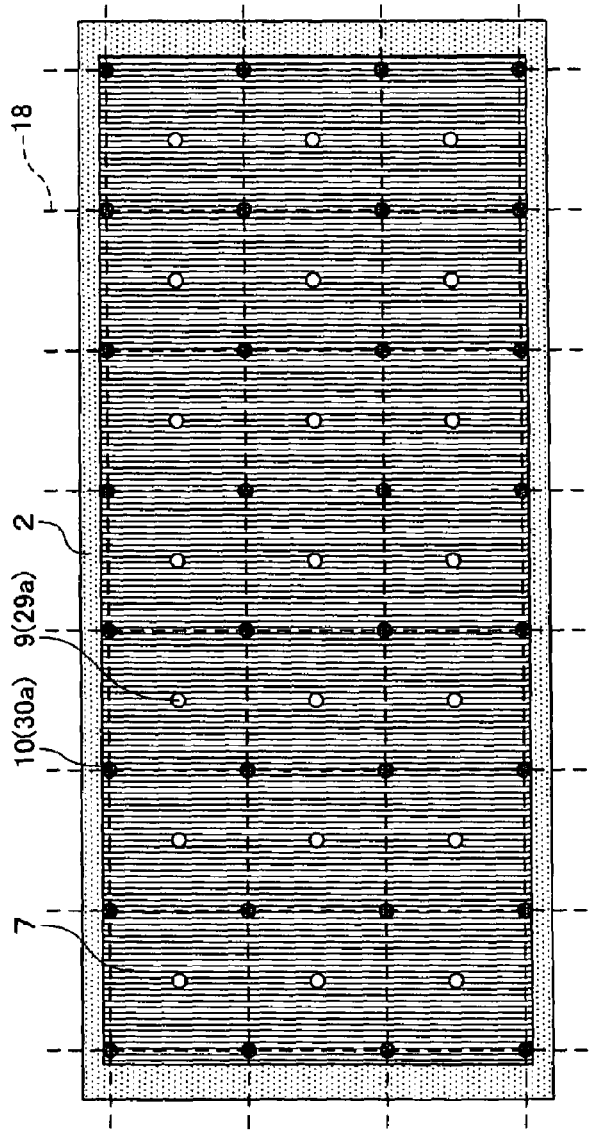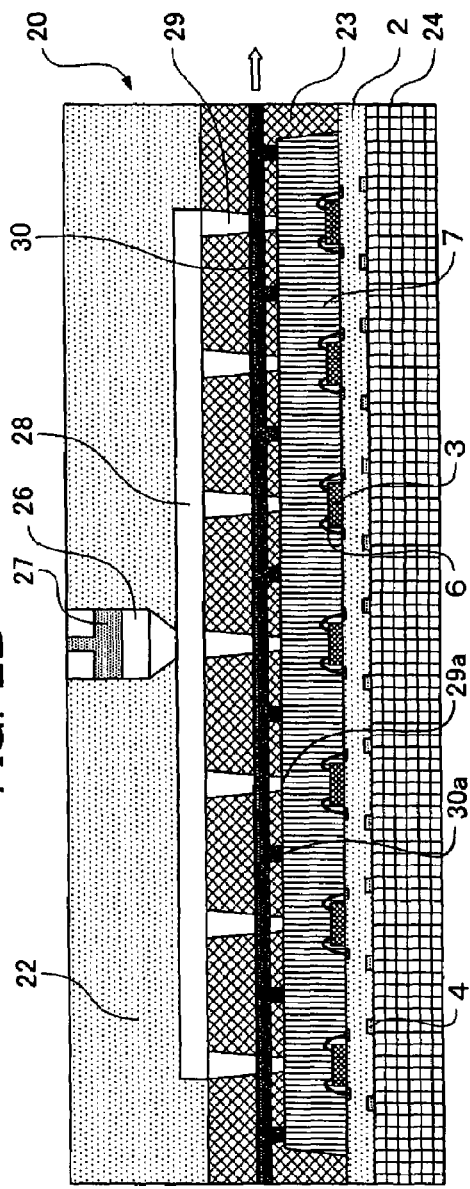

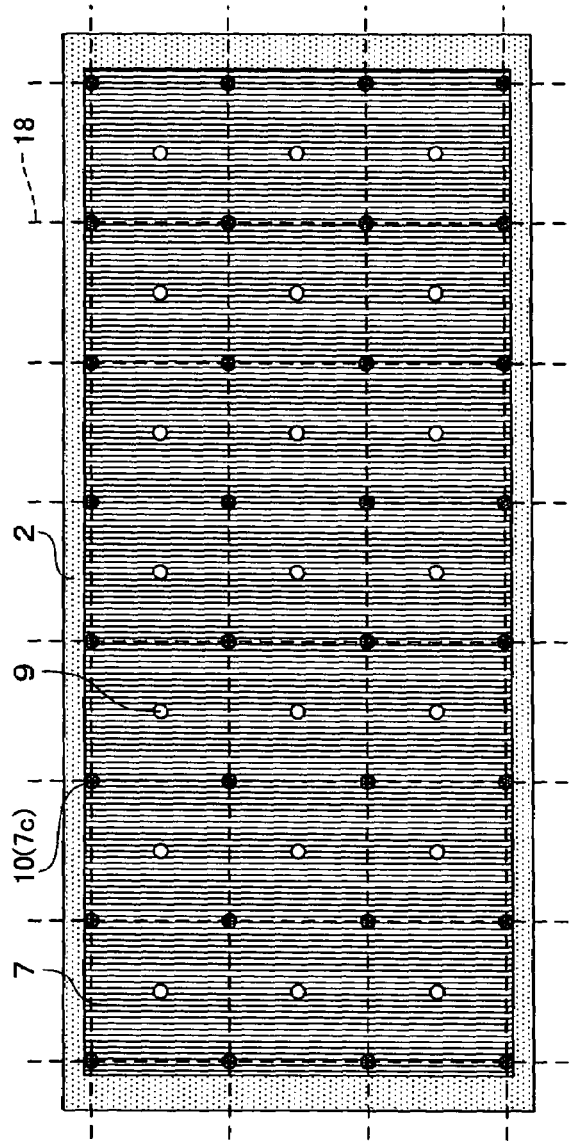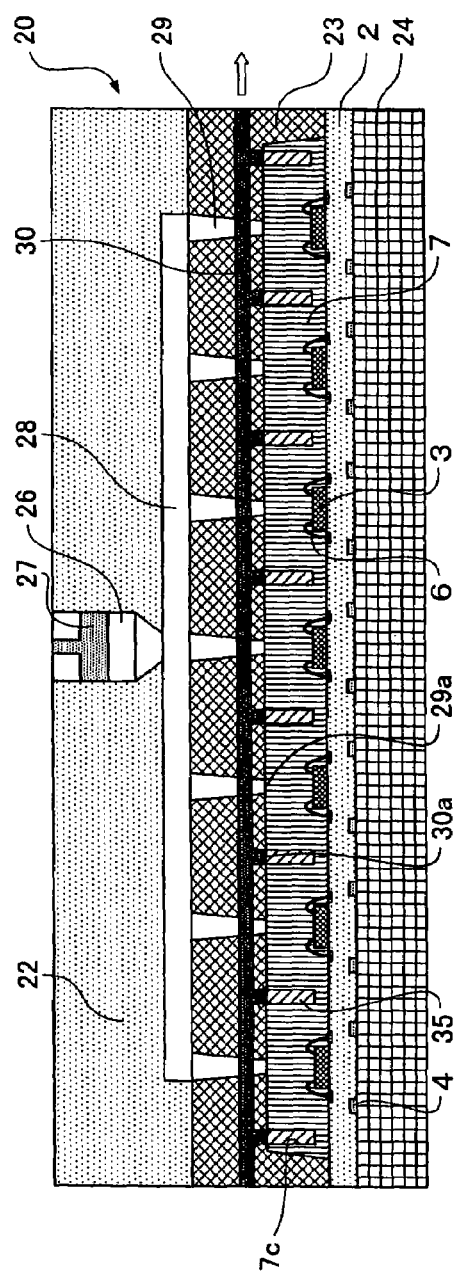

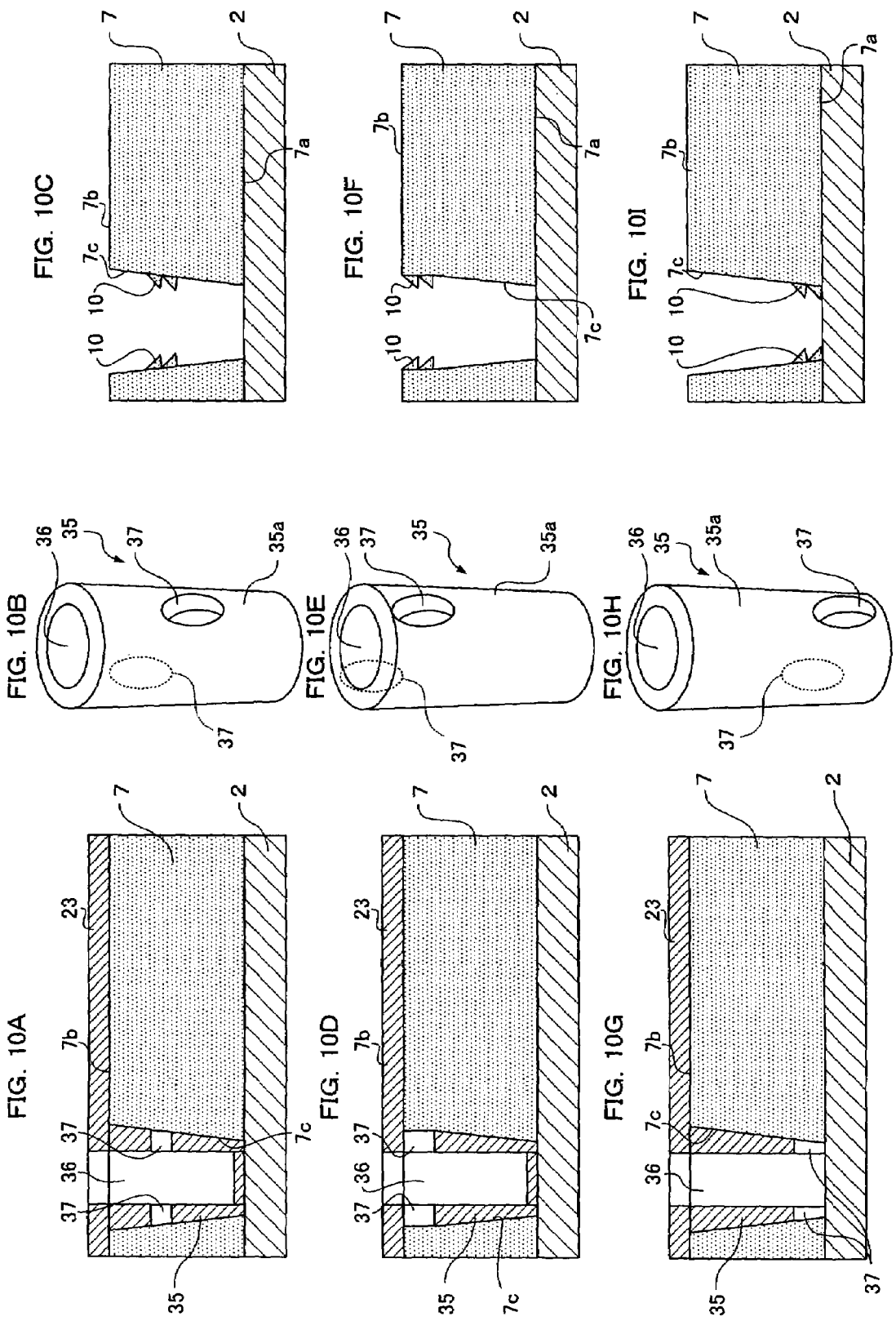

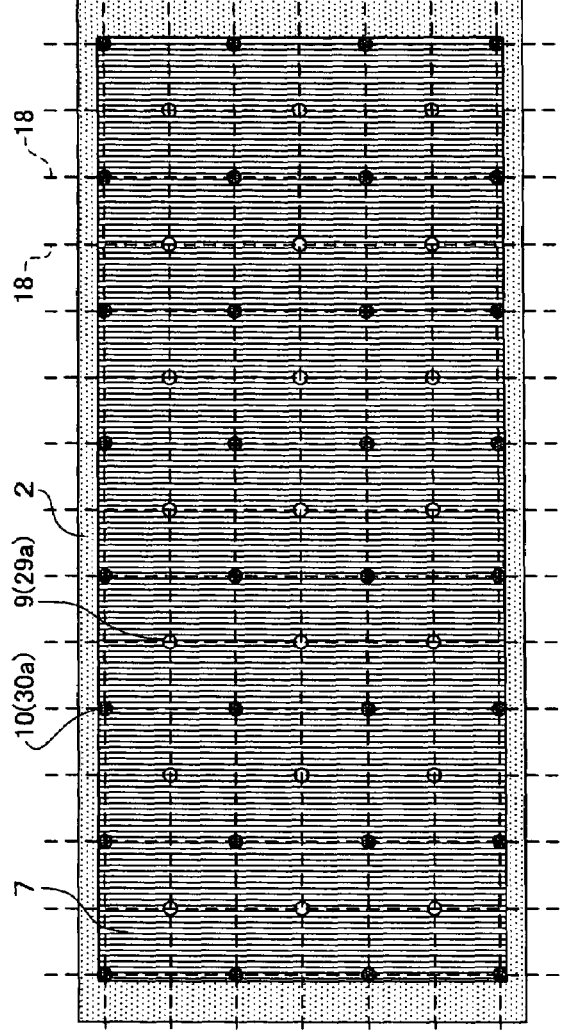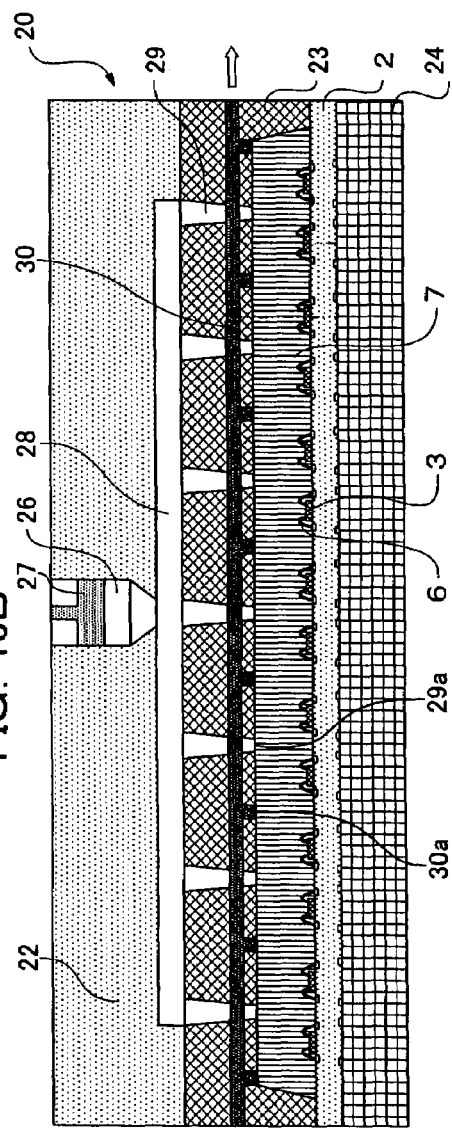

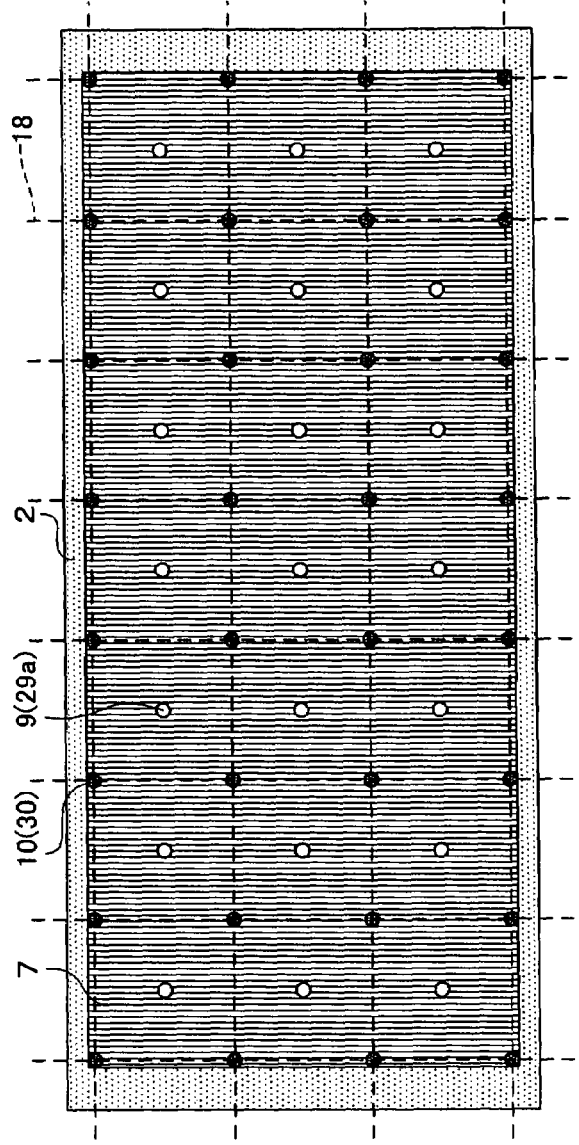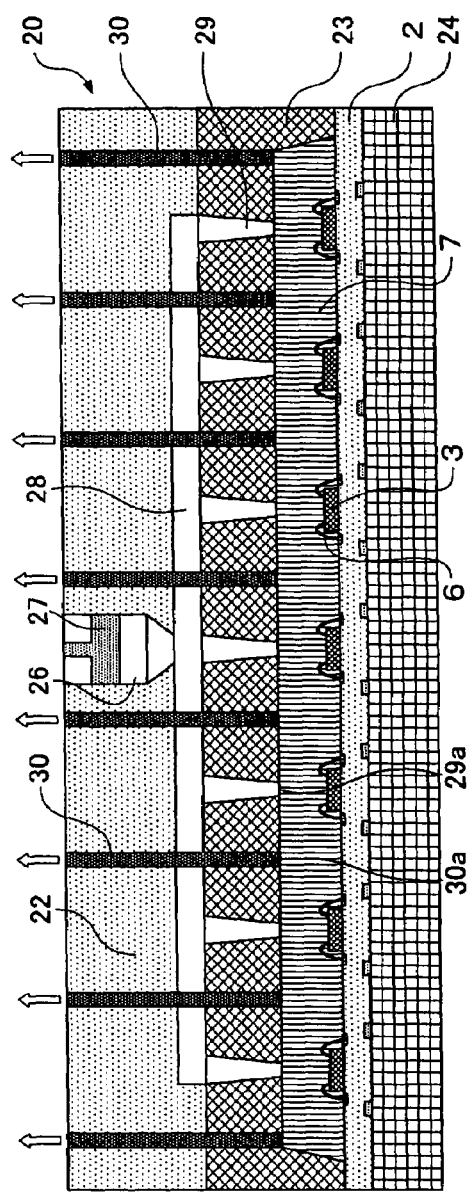

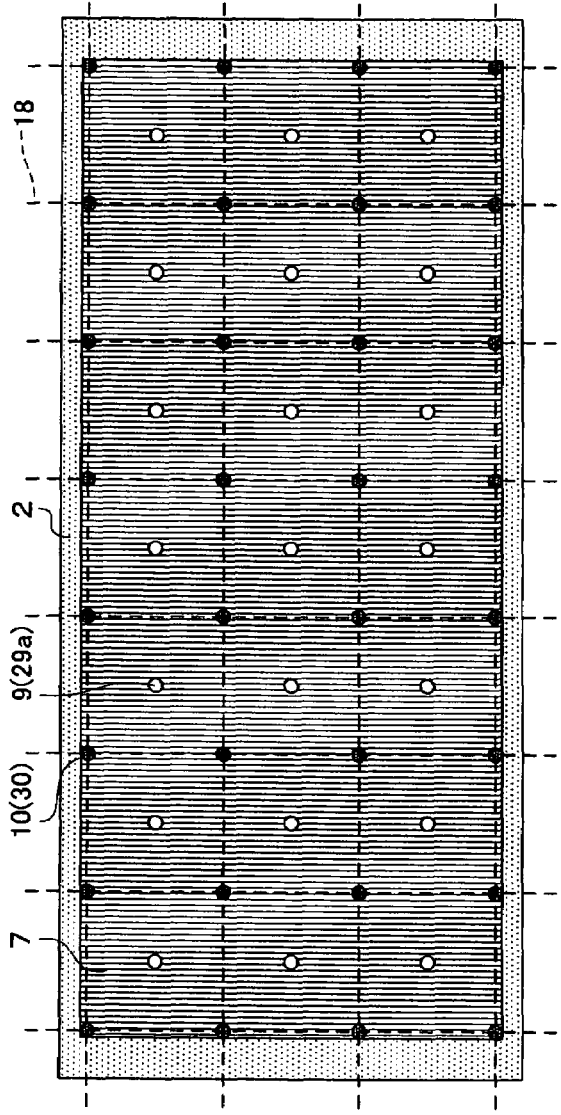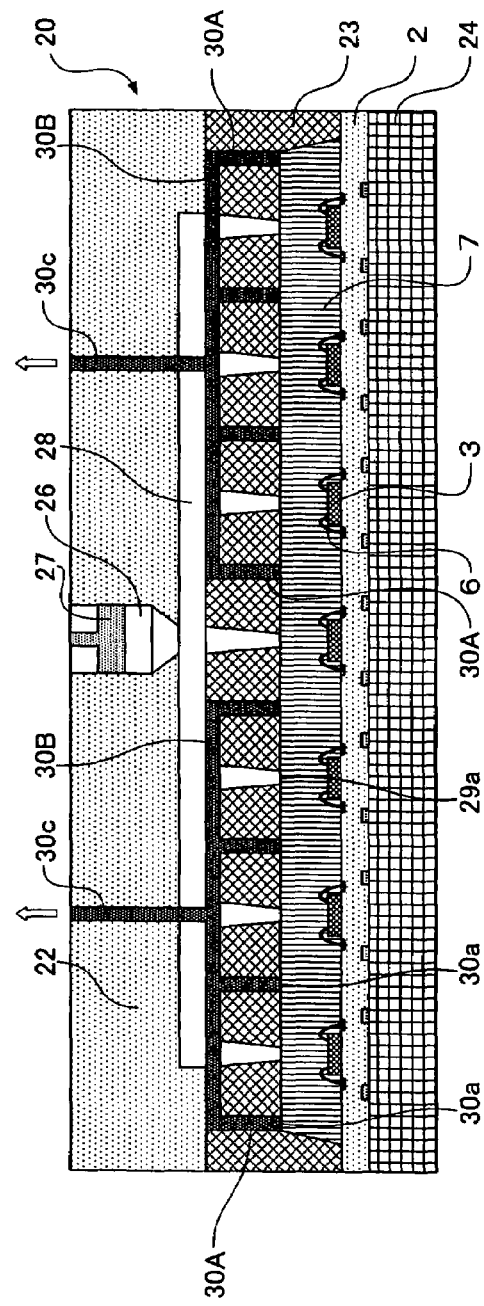

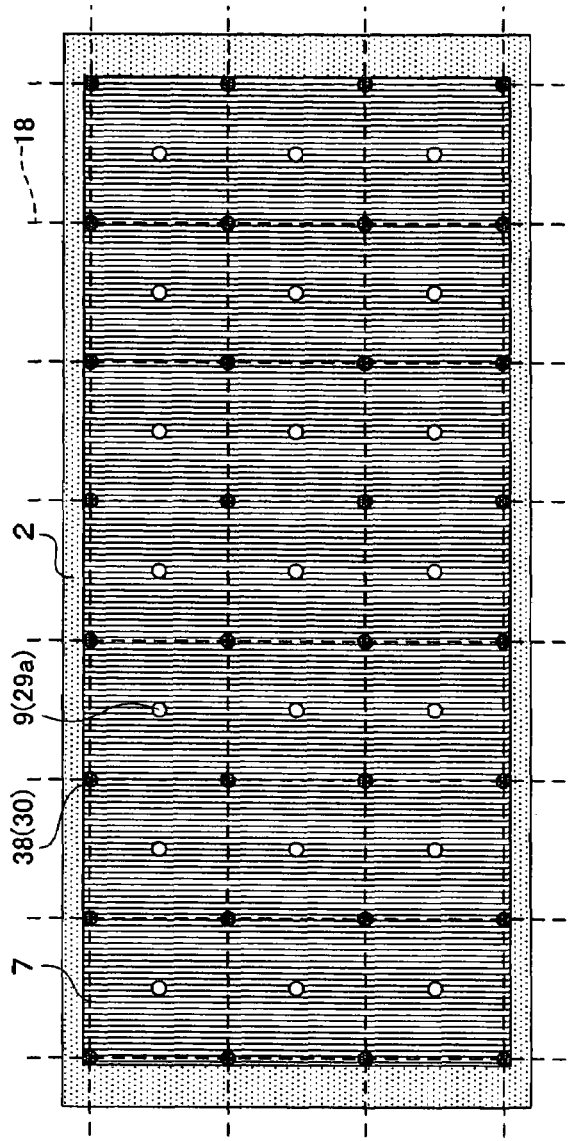
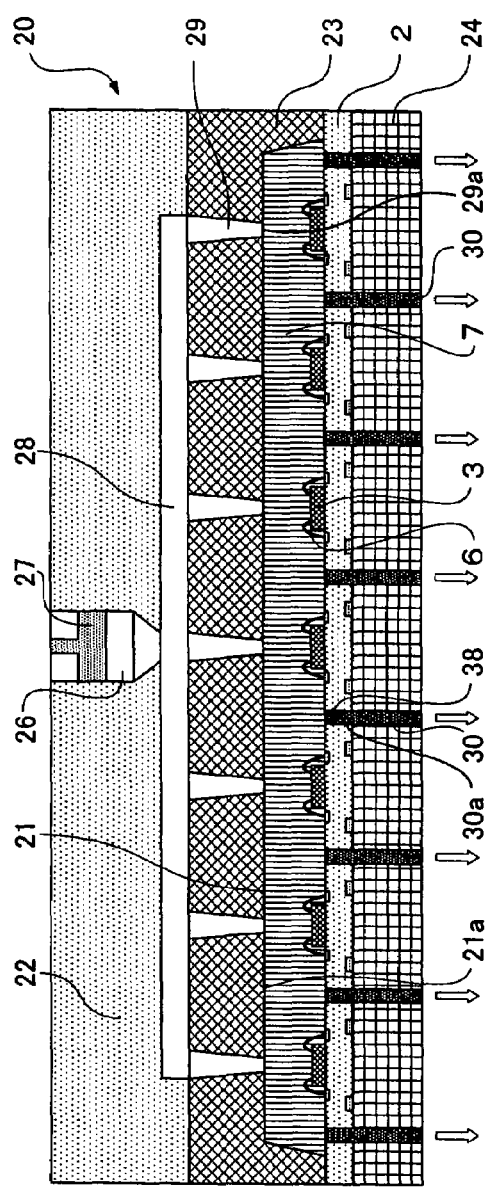
FIG. 17A
FIG. 17B

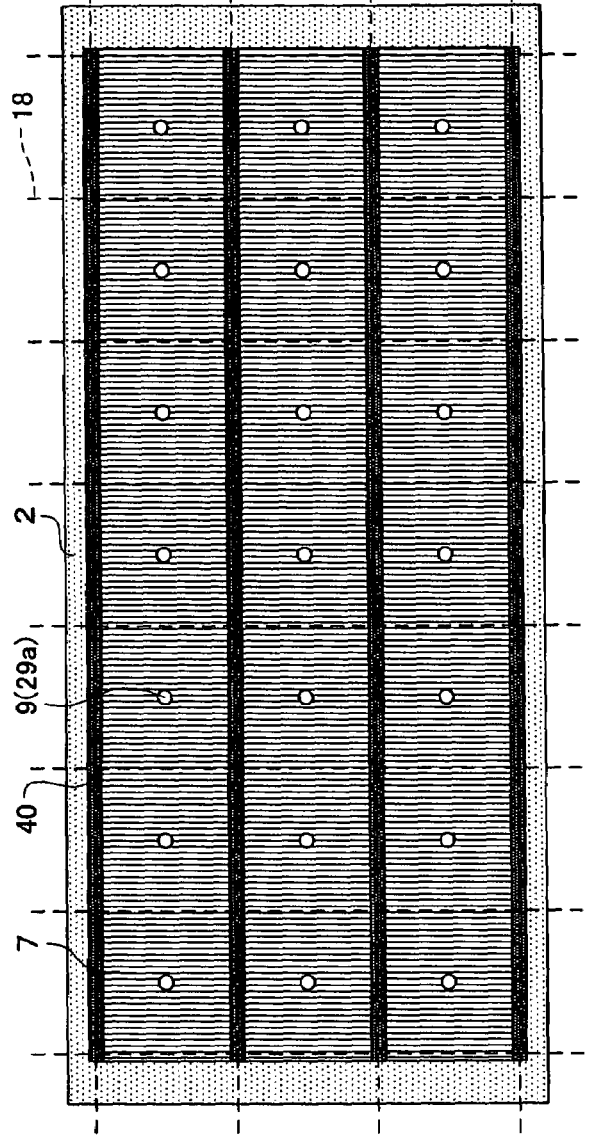
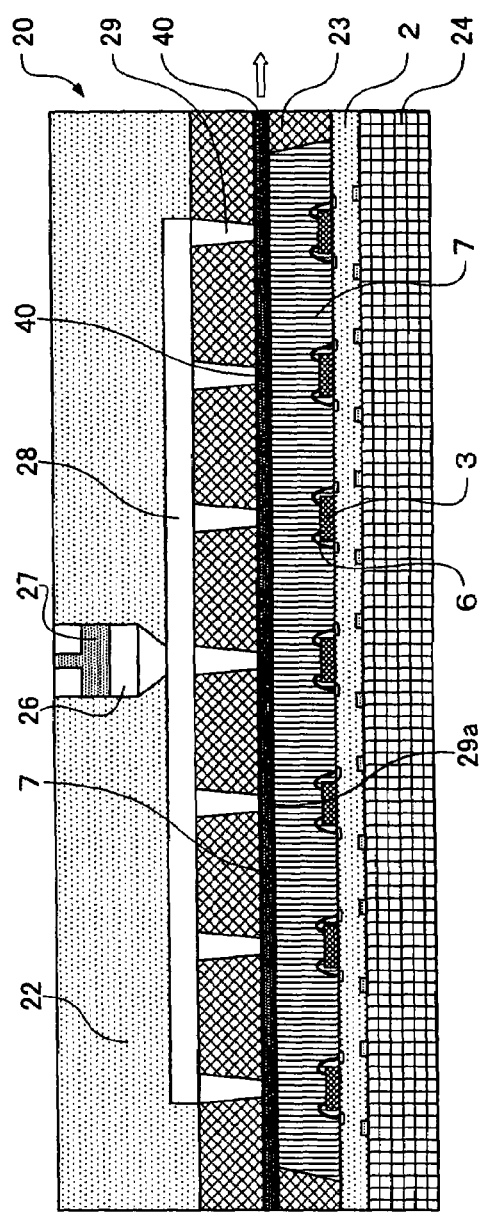
FIG. 20A
FIG. 20B

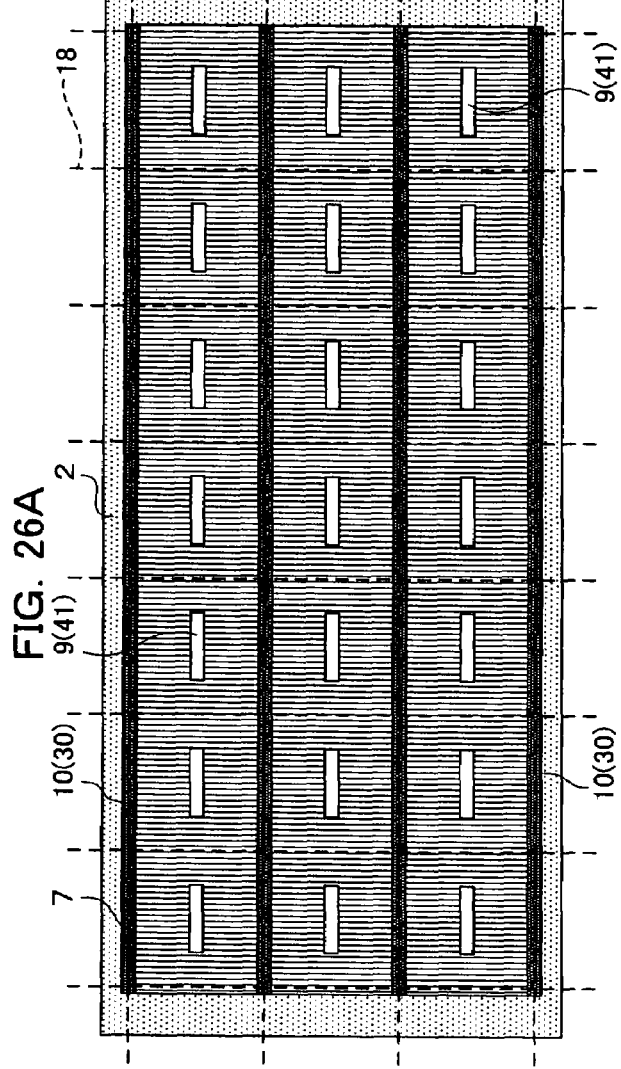
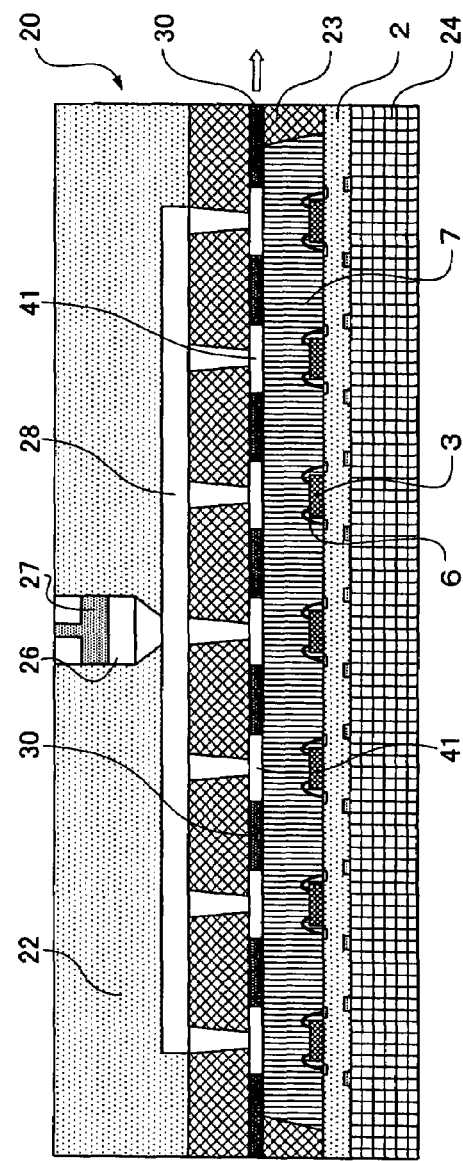
FIG. 26A
FIG. 26B

US 7,482,701 B2

PRODUCTION EQUIPMENT OF RESIN MOLDING SEMICONDUCTOR DEVICE, METHOD OF MANUFACTURING RESIN MOLDING SEMICONDUCTOR DEVICE, AND RESIN MOLDING SEMICONDUCTOR DEVICE

FIELD OF THE INVENTION

The present invention relates to resin molding semiconductor devices that are applicable as electronic parts in the field of small electronic equipment including digital electric appliances and mobile phones, and methods and production equipments for manufacturing resin molding semiconductor devices.

BACKGROUND OF THE INVENTION

Conventional resin molding semiconductor devices have been manufactured by mounting semiconductor elements on a substrate, connecting electrodes on each semiconductor element to electrodes on the substrate via bonding wires, and molding the integrated semiconductor device with resin so as to wrap the semiconductor device. Specifically, the conventional resin molding semiconductor device has been manufactured by executing a resin molding process (transfer mold) comprising installing the semiconductor device in a cavity of a mold, injecting and filling a molten resin into the cavity through a gate, and hardening the resin.

As the advanced information-oriented society develops, stronger demands have been made to reduce the sizes and thicknesses of a group of products in the small electronic equipment field which are used in the advanced information-oriented society, and improve the functions thereof. In connection with the manufacture of semiconductor elements, key devices for the group of products, a reduction in the sizes and pitches of semiconductor elements has been strongly demanded. Resin molding semiconductor devices with the semiconductor elements mounted thereon are strongly demanded to have a structure including long wires or narrow pat pitch connections and in which electrodes on the semiconductor elements are electrically connected to many electrodes mounted on the substrate.

A method for manufacturing the resin molding semiconductor device has included the step of injecting resin into the cavity of the mold through the side surface of the cavity. However, with this method, the resin flows along the direction in which wires are arranged. Consequently, a wire coming into contact with the resin may be swept away by the resin to flow toward the adjacent wire. In this case, the wires contact each other to cause a short circuit.

A manufacturing method for inhibiting such a problem is proposed by, for example, Japanese Patent Laid-Open No. 2005-347514. According to this method, a gate is formed on a surface of the cavity which is located opposite a front surface of the semiconductor element and the resin is ejected from the gate toward the front surface of the semiconductor element.

With reference to FIGS. 28A to 28C and 29, a description will be given of a method for manufacturing such a conventional resin molding semiconductor device as described above. FIG. 28A is a plan view of a resin molding semiconductor device having a gate, that is, a resin injection port, formed on a surface of a cavity which is located opposite a front surface of each semiconductor element. FIG. 28B is a sectional view of the resin molding semiconductor device taken along line A-A' in FIG. 28A. FIG. 28C is an enlarged plan view of a portion B in FIG. 28A. FIG. 29 is a sectional view showing a production equipment for manufacturing the resin molding semiconductor device.

As shown in FIGS. 28A to 28C and 29, the resin molding semiconductor device is manufactured by mounting a semiconductor element 52 on a substrate 51 and injecting a molding resin 54 toward a front surface of the semiconductor element 52 through a gate (resin injection port) 53 formed on a surface of a cavity 64 in molds 61, 62, and 63 which is located opposite the semiconductor element 52, to fill the cavity 64 with the molding resin 54. Here, reference numeral 55 in FIG. 28B denotes a wire, and reference numeral 56 denotes a solder ball. In FIG. 29, reference numerals 61, 62, and 63 denote an upper mold, an intermediate mold, and a lower mold, in order. Reference numeral 65 denotes a plunger for pushing the molding resin 54 into the cavity 64 through a runner 66. Reference numeral 67 denotes an air vent portion formed in an area of the upper mold 61 which is located opposite a top surface of the substrate 51.

In connection with such a resin molding semiconductor device, for example, Japanese Patent Laid-Open No. 2000-124239 proposes the production of a resin molding semiconductor device involving executing one molding process to mold a plurality of semiconductor elements 52 in order to reduce production time and subsequently cutting the semiconductor elements 52 off from one another.

However, even with the manufacturing method of forming the gate (resin injection port) in the surface of the mold located opposite the surface of the semiconductor element and ejecting resin from the gate to the surface of the semiconductor element, the following problem may occur. When the conventional method for manufacturing a resin molding semiconductor device wherein air in the cavity is discharged from the side surface of the cavity in the mold located along the surface of the substrate, is adopted, a plurality of semiconductor elements are mounted on one substrate and molded at a time to manufacture a large number of resin molding semiconductor devices at a time, the cavity area on the substrate increases consistently with the number of resin molding semiconductor devices. This significantly increases the distance from the resin injection port to the air vent for air discharge into which the resin is finally injected. As a result, during rein injection, air is likely to be mixed in the resin molding portion, where an internal void is thus likely to occur.

In the resin molding semiconductor device, when such a void is present in the resin, the resin is likely to be cracked at the void. This affects the reliability of the resin molding semiconductor device.

This also limits the size of the cavity, preventing an increase in the area that can be molded at a time. As a result, productivity cannot be improved.

DISCLOSURE OF THE INVENTION

The present invention solves the above problems. An object of the present invention is to provide a production equipment and method for manufacturing a resin molding semiconductor device which allows a large number of resin molding semiconductor devices at a time by mounting a plurality of semiconductor elements on one substrate and ejecting resin from a gate to surfaces of the semiconductor elements to mold the semiconductor elements at a time, while minimizing the likelihood that an internal void occurs in a resin molding portion, as well as a resin molding semiconductor device manufactured using the above method and production equipment.

To accomplish the above object, the production equipment and method for manufacturing a resin molding semiconductor device and the resin molding semiconductor device in accordance with the present invention have the features described below.

A production equipment for manufacturing a resin molding semiconductor device in accordance with the present invention includes a substrate having a front surface portion with a plurality of chip mounting areas in each of which a semiconductor element is mounted, electrodes each provided on the front surface portion around an outer periphery of the corresponding chip mounting area and electrically connected to a corresponding electrode provided on the corresponding semiconductor element, a back surface portion, and external terminals provided on the back surface portion, the plurality of semiconductor elements and regions in each of which the electrodes on the semiconductor element is connected to the electrode on the substrate being entirely covered with molding resin. The production equipment comprises the substrate placed inside and having the plurality of semiconductor elements mounted thereon, and a resin molding mold having a cavity that is a molding resin injection space. The mold has resin injection ports from which a molding resin is injected into the cavity and air release ports from which air in the cavity is released during resin injection. Each of the resin injection ports is formed in a top surface portion of the cavity in the mold in association with the corresponding semiconductor element or a plurality of semiconductor elements. Each of the air release ports is formed in association with the corresponding semiconductor element or a plurality of the semiconductor elements so that the air release ports lie around each of the resin injection ports in a plan view in which the semiconductor device is viewed in a thickness direction of the substrate and the molding resin.

The production equipment for manufacturing the resin molding semiconductor device injects the molding resin into the cavity through the resin injection ports, each formed in the area of the mold which corresponds to the top surface portion of the cavity, in association with the corresponding semiconductor element or a plurality of the semiconductor elements, to fill the cavity with the resin, while discharging the air in the cavity through the air release ports, each formed in association with the corresponding semiconductor element or a plurality of the semiconductor elements so that the air release ports lie around each of the resin injection ports in a plan view in which the semiconductor device is viewed in a thickness direction of the substrate and the molding resin. Consequently, compared to the conventional production equipment discharging the air in the cavity in the mold from the side surface of the cavity located along the substrate surface, the present production equipment enables a reduction in the distance between the resin injection port and the air release port. This makes it possible to inhibit air from being mixed in the resin during resin injection, minimizing the likelihood that an internal void occurs in the resin molding portion. Thus, the area that can be molded with the resin at a time can be increased, allowing productivity to be improved.

The air release ports may be dotted around or linearly arranged around the resin injection ports when viewed planarity in the thickness direction of the molding resin. This enables the air in the cavity to be appropriately discharged, allowing the prevention of a possible void inside the resin molding portion.

Each of the air release ports may be formed in an area of the mold which corresponds to the top surface portion of the cavity or in an area of the mold which corresponds to the back surface portion of the substrate.

In the production equipment for manufacturing the resin molding semiconductor device, the mold has an air discharge path connected to the air release ports. A tip portion of the air discharge path is open in the cavity top surface portion of the mold. The mold has a cylindrical pin having an air releasing passage and an air release port both connected to the air discharge path, the cylindrical pin serving as an auxiliary intermediate mold, the cylindrical pin extending from the cavity top surface portion of the mold toward the front surface portion of the substrate.

This configuration allows the air in the cavity to be appropriately discharged through the air release port and the air releasing passage, formed in the cylindrical pin, serving as an auxiliary intermediate mold.

The pin preferably has a draft angle inclined and formed on an outer peripheral surface thereof so that a cross section in the outer peripheral surface decreases as the pin approaches a tip thereof, to allow the pin to be easily removed after a resin molding process. This enables the pin to be appropriately removed in removing the mold.

Alternatively, the pin may have an air releasing passage extending along an axial direction and a through-hole which is formed in the outer peripheral surface of the pin as an air release port and which connects to the air releasing passage in an inner portion thereof.

A production equipment for manufacturing a resin molding semiconductor device in accordance with the present invention includes a substrate having a front surface portion with a plurality of chip mounting areas in each of which a semiconductor element is mounted, electrodes each provided on the front surface portion around an outer periphery of the corresponding chip mounting area and electrically connected by a connector to a corresponding electrode provided on the corresponding semiconductor element, a back surface portion, and external terminals provided on the back surface portion, the resin molding semiconductor device being obtained by entirely molding the plurality of semiconductor elements, the plurality of chip mounting areas and the electrodes on the front surface portion of the substrate, and the connectors with molding resin and dividing the molded substrate and molding resin portion into pieces along dividing lines. The production equipment comprises the substrate placed inside and having the plurality of semiconductor elements mounted thereon, and a resin molding mold having a cavity that is a molding resin injection space. The mold has resin injection ports from which a molding resin is injected into the cavity and air release ports from which air in the cavity is released during resin injection. Each of the resin injection ports being formed in a top surface portion of the cavity in the mold in association with the corresponding semiconductor element or a plurality of semiconductor elements. Each of the air release ports is formed so that the air release ports lie around each of the resin injection ports, while overlapping the dividing lines, in a plan view in which the semiconductor device is viewed in a thickness direction of the substrate and the molding resin.

This production equipment for manufacturing the resin molding semiconductor device also enables a reduction in the distance between the resin injection port and the air release port. This makes it possible to inhibit air from being mixed in the resin during resin injection, minimizing the likelihood that an internal void occurs in the resin molding portion. Thus, the area that can be molded with the resin at a time can be increased, allowing productivity to be improved. Moreover, the air release ports overlap the dividing lines. This eliminates some air release port impressions formed at the air release ports during the division. Thus, the depressions in the finished resin molding semiconductor device can be made unnoticeable.

In this case, fitting the size of the air release port within the width of the dividing line prevents air release port impressions from remaining after division. This enables the formation of an appropriate shape.

Alternatively, the resin injection ports may be formed so as to overlap the dividing lines along which the substrate and the molding resin port are divided into pieces when viewed planarity along the thickness direction of the molding resin. This also eliminates some resin injection port impressions formed at the resin injection ports during the division. Thus, the depressions in the finished resin molding semiconductor device can be made unnoticeable.

A method for manufacturing a resin molding semiconductor device in accordance with the present invention comprises the steps of forming electrodes in a front surface portion of a substrate having a plurality of chip mounting areas in each of which a semiconductor element is mounted, at positions located around an outer periphery of the respective chip mounting areas and forming external terminals on a back surface portion of the substrate in association with the respective chip mounting areas, mounting each of the semiconductor elements with the electrodes in the corresponding chip mounting area of the substrate, electrically connecting the electrodes on the substrate to the electrodes on the semiconductor elements via connectors, molding the plurality of semiconductor elements, the plurality of chip mounting areas and electrodes on the front surface portion of the substrate, and the connectors with a cavity located along the substrate surface, the present production equipment enables a reduction in the distance between the resin injection port and the air release port. This makes it possible to inhibit air from being mixed in the resin during resin injection, minimizing the likelihood that an internal void occurs in the resin molding portion. Thus, the area that can be molded with the resin at a time can be increased, allowing productivity to be improved.

A resin molding semiconductor device in accordance with the present invention comprises a substrate, a chip mounting area on a front surface portion of the substrate in which a semiconductor element is mounted, an electrode disposed around an outer periphery of the chip mounting area, and an external terminal on a back surface portion of the substrate, the semiconductor element with the electrode being mounted in the chip mounting area of the substrate, the electrode on the substrate being electrically connected to the electrode on the semiconductor element via a connector, the semiconductor element, the chip mounting area and electrode on the front surface portion of the substrate, and the connector being covered with a molding resin portion. A resin injection port impression with a projecting and recessed shape with the molding resin injected therein is present in a top surface portion of the molding resin portion which is located opposite a bottom surface portion of the molding resin portion which contacts the front surface portion of the substrate, and an air release port impression with a recessed and projecting shape from which air is released during resin injection is present in the top surface portion of the molding resin portion or in a recessed portion of the top surface portion. In this case, the recessed portion of the top surface portion is exposed from a side surface of the molding molding resin, and dividing the substrate molded with the resin into pieces. The resin molding comprises the steps of disposing the substrate with the plurality of semiconductor elements mounted thereon inside a mold having a cavity that is a molding resin injection space, and injecting the molding resin into the cavity through resin injection ports each formed, in association with the corresponding semiconductor element or a plurality of the semiconductor elements, in a cavity top surface portion of the mold which is located opposite the front surface portion of the substrate, to mold the plurality of semiconductor elements, the plurality of chip mounting areas and electrodes on the front surface portion of the substrate, and the connectors with the molding resin for batch molding, while releasing air from air release ports each formed in association with the corresponding semiconductor element or a plurality of the semiconductor elements so that the air release ports lie around each of the resin injection ports in a plan view in which the semiconductor device is viewed in a thickness direction of the molding resin portion.

This method injects and fills the molding resin into the cavity through the resin injection ports each formed, in association with the corresponding semiconductor element or a plurality of the semiconductor elements, in the cavity top surface portion of the mold. At this time, the air in the cavity is discharged from the air release ports each formed in association with the corresponding semiconductor element or a plurality of semiconductor elements so that the air release ports lie around each of the resin injection ports in a plan view in which the semiconductor device is viewed in the thickness direction of the molding resin portion. Consequently, compared to the conventional production equipment discharging the air in the cavity in the mold from the side surface of the resin portion or is shaped like an almost quarter circle in a plan view. The side surface portion of the molding resin portion is substantially flush with a side surface portion of the substrate.

BRIEF DESCRIPTION OF THE DRAWINGS

FIGS. 1A to 1C show a resin molding semiconductor device manufactured by a method and production equipment for manufacturing a resin molding semiconductor device in accordance with a first embodiment of the present invention, wherein FIG. 1A is a plan view of the resin molding semiconductor device, FIG. 1B is a simplified sectional view of the resin molding semiconductor device taken along line A-A' in FIG. 1A, and FIG. 1C is a simplified sectional view of the resin molding semiconductor device taken along line B-B' in FIG. 1A;

FIG. 2A is a plan view of the resin molding semiconductor device (not divided yet), and FIG. 2B is a sectional view schematically showing a step of molding the resin molding semiconductor device with resin;

FIGS. 6A to 6C show a resin molding semiconductor device manufactured by a method and production equipment for manufacturing a resin molding semiconductor device in accordance with a second embodiment of the present invention, wherein FIG. 6A is a plan view of the resin molding semiconductor device, FIG. 6B is a simplified sectional view of the resin molding semiconductor device taken along line A-A' in FIG. 6A, and FIG. 6C is a simplified sectional view of the resin molding semiconductor device taken along line B-B' in FIG. 6A;

FIG. 7A is a plan view of the resin molding semiconductor device (not divided yet), and FIG. 7B is a sectional view schematically showing a step of molding the resin molding semiconductor device with resin;

FIGS. 9A to 9C show a resin molding semiconductor device manufactured by a method and production equipment for manufacturing a resin molding semiconductor device in accordance with a second embodiment of the present invention, wherein FIG. 9A is a plan view of the resin molding semiconductor device, FIG. 9B is a simplified sectional view of the resin molding semiconductor device taken along line A-A' in FIG. 9A, and FIG. 9C is a simplified sectional view of the resin molding semiconductor device taken along line B-B' in FIG. 9A;

FIGS. 10A, 10D, and 10G are each a sectional view of a variation of the resin molding semiconductor device with the pin installed therein, FIGS. 10B, 10E, and 10H are each a perspective view of the pin, and FIGS. 10C, 10F, and 10I are each a sectional view of a variation of the resin molding semiconductor device molded with resin and from which the pin has been removed;

FIGS. 12A to 12C show another example of resin molding semiconductor device manufactured by the method and production equipment for manufacturing a resin molding semiconductor device in accordance with the second embodiment of the present invention, wherein FIG. 12A is a plan view of the resin molding semiconductor device, FIG. 12B is a simplified sectional view of the resin molding semiconductor device taken along line A-A' in FIG. 12A, and FIG. 12C is a simplified sectional view of the resin molding semiconductor device taken along line B-B' in FIG. 12A;

FIG. 13A is a plan view of a resin molding semiconductor device (not divided yet) manufactured by the method and production equipment for manufacturing a resin molding semiconductor device in accordance with the second embodiment of the present invention, and FIG. 13B is a sectional view schematically showing a step of molding the resin molding semiconductor device with resin;

FIG. 15A is a plan view of a resin molding semiconductor device (not divided yet) manufactured by a method and production equipment for manufacturing a resin molding semiconductor device in accordance with a fourth embodiment of the present invention, and FIG. 15B is a sectional view schematically showing a step of molding the resin molding semiconductor device with resin;

FIG. 16A is a plan view of a resin molding semiconductor device (not divided yet) manufactured by a method and production equipment for manufacturing a resin molding semiconductor device in accordance with a variation of the fourth embodiment of the present invention, and FIG. 16B is a sectional view schematically showing a step of molding the resin molding semiconductor device with resin;

FIG. 17A is a plan view of a resin molding semiconductor device (not divided yet) manufactured by a method and production equipment for manufacturing a resin molding semiconductor device in accordance with a fifth embodiment of the present invention, and FIG. 17B is a sectional view schematically showing a step of molding the resin molding semiconductor device with resin;

FIGS. 18A to 18C show another example of resin molding semiconductor device manufactured by the method and production equipment for manufacturing a resin molding semiconductor device, wherein FIG. 18A is a plan view of the resin molding semiconductor device, FIG. 18B is a simplified sectional view of the resin molding semiconductor device taken along line A-A' in FIG. 18A, and FIG. 18C is a simplified sectional view of the resin molding semiconductor device taken along line B-B' in FIG. 18A;

FIG. 20A is a plan view of a resin molding semiconductor device (not divided yet) manufactured by a method and production equipment for manufacturing a resin molding semiconductor device in accordance with a sixth embodiment of the present invention, and FIG. 20B is a sectional view schematically showing a step of molding the resin molding semiconductor device with resin;

FIGS. 22A to 22C show a resin molding semiconductor device manufactured by the method and production equipment for manufacturing a resin molding semiconductor device, wherein FIG. 22A is a plan view of the resin molding semiconductor device, FIG. 22B is a simplified sectional view of the resin molding semiconductor device taken along line A-A' in FIG. 22A, and FIG. 22C is a simplified sectional view of the resin molding semiconductor device taken along line B-B' in FIG. 22A;

FIGS. 23A to 23C show a resin molding semiconductor device manufactured by the method and production equipment for manufacturing a resin molding semiconductor device, wherein FIG. 23A is a plan view of the resin molding semiconductor device, FIG. 23B is a simplified sectional view of the resin molding semiconductor device taken along line A-A' in FIG. 23A, and FIG. 23C is a simplified sectional view of the resin molding semiconductor device taken along line B-B' in FIG. 23A;

FIGS. 24A to 24C show a resin molding semiconductor device manufactured by the method and production equipment for manufacturing a resin molding semiconductor device, wherein FIG. 24A is a plan view of the resin molding semiconductor device, FIG. 24B is a simplified sectional view of the resin molding semiconductor device taken along line A-A' in FIG. 24A, and FIG. 24C is a simplified sectional view of the resin molding semiconductor device taken along line B-B' in FIG. 24A;

FIGS. 25A to 25C show a resin molding semiconductor device manufactured by the method and production equipment for manufacturing a resin molding semiconductor device, wherein FIG. 25A is a plan view of the resin molding semiconductor device, FIG. 25B is a simplified sectional view of the resin molding semiconductor device taken along line A-A' in FIG. 25A, and FIG. 25C is a simplified sectional view of the resin molding semiconductor device taken along line B-B' in FIG. 25A;

FIG. 26A is a plan view of a resin molding semiconductor device (not divided yet) manufactured by a method and production equipment for manufacturing a resin molding semiconductor device in accordance with a seventh embodiment of the present invention, and FIG. 26B is a sectional view schematically showing a step of molding the resin molding semiconductor device with resin;

FIGS. 27A to 27C show a resin molding semiconductor device manufactured by the method and production equipment for manufacturing a resin molding semiconductor device, wherein FIG. 27A is a plan view of the resin molding semiconductor device, FIG. 27B is a simplified sectional view of the resin molding semiconductor device taken along line A-A' in FIG. 27A, and FIG. 27C is a simplified sectional view of the resin molding semiconductor device taken along line B-B' in FIG. 27A;

FIGS. 28A to 28C are drawings of a conventional resin molding semiconductor device, wherein FIG. 28A is a plan view of the resin molding semiconductor device not divided yet, FIG. 28B is a simplified sectional view of the resin molding semiconductor device taken along line A-A' in FIG. 28A, and FIG. 28C is an enlarged plan view of a portion B in FIG. 28A.

DESCRIPTION OF THE EMBODIMENTS

A description will be given below of a resin molding semiconductor device, a method for manufacturing the resin molding semiconductor device, and a production equipment for manufacturing the resin molding semiconductor device which production equipment is used for the manufacturing method.

Figure 1A:
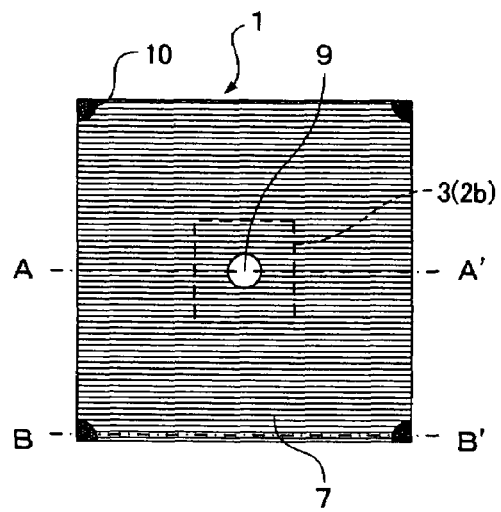
Figure 1B:
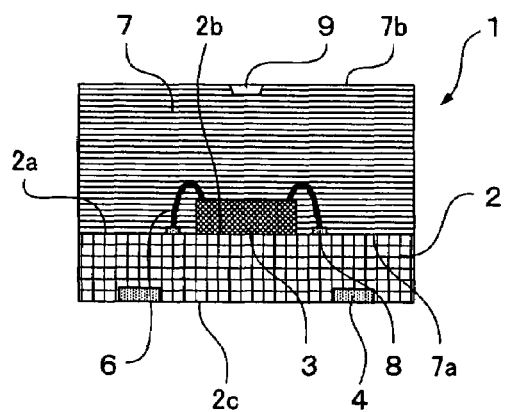
Figure 1C:
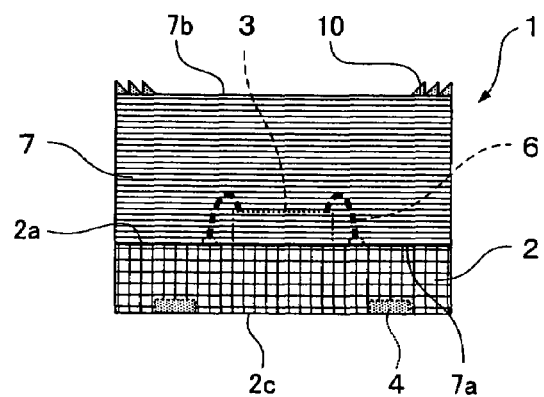

FIGS. 1A to 1C show a resin molding semiconductor device manufactured by a method and production equipment for manufacturing a resin molding semiconductor device in accordance with a first embodiment of the present invention. FIG. 1A is a plan view of the resin molding semiconductor device. FIG. 1B is a simplified sectional view of the resin molding semiconductor device taken along line A-A' in FIG. 1A. FIG. 1C is a simplified sectional view of the resin molding semiconductor device taken along line B-B' in FIG. 1A.

As shown in FIGS. 1A to 1C, a substrate 2 of a resin molding semiconductor device 1 has, on a front surface portion (in the condition shown in FIGS. 1A to 1C, the front surface portion corresponds to what is called a top surface) 2a, that is, one surface thereof, a chip mounting area 2b in which a semiconductor element 3 is mounted, an electrode 8 disposed around the outer periphery of the chip mounting area 2b in a plan view of the front surface portion 2a, and external terminals 4 on a back surface portion (in the condition shown in FIGS. 1A to 1C, the back surface portion corresponds to what is called a bottom surface) 2c, located opposite the front surface portion 2a of the substrate 2. The semiconductor element 3 having an electrode (not shown) is mounted in the chip mounting area 2b of the substrate 2. The electrode 8 on the substrate 2 is electrically connected to the electrode on the semiconductor element 3 via a wire 6 serving as a connector. The entire front surface portion 2a of the substrate 2 including the semiconductor element 3 and the wire 6 is covered with a molding resin (a portion of the resin molding semiconductor device which is formed of the molding resin is hereinafter referred to as a molding resin portion 7).

A resin injection port impression 9 with the molding resin injected therein and an air release port impression 10 from which air is released during resin injection are present in a top surface portion 7b (corresponding to what is called a top surface) located opposite a bottom surface portion 7a that is in tight contact with the front surface portion 2a of the substrate 2; each of the resin injection port impression 9 and the air release port impression 10 has a recessed and projecting shape. In this embodiment, the resin injection port impression 9 is shaped substantially like a circle and is formed in a substantially central area of the resin molding portion 7 in a plan view in which the device is viewed in the thickness direction of the substrate 2 and the molding resin portion 7. Air release port impressions 10 are shaped substantially like circular arcs corresponding to quarter circles and are formed in the respective corners of the molding resin portion 7 in a plan view. The side portion of the resin molding portion 7 is formed generally flush with the side portion of the substrate 2.

The resin molding semiconductor device 1 is finally commercialized as the substrate 2 comprising one semiconductor element 3. However, during a manufacturing process, as shown in FIGS. 2A and 2B, a plurality of semiconductor elements 3 are manufactured so as to be mounted in the chip mounting area 2b both in a vertical direction and in a horizontal direction in a plan view. Further, in the present embodiment, the single, integral molding resin portion 7 is formed on the substrate 2 (a plurality of finally commercialized resin molding semiconductor devices 1 are integrated into a single resin molding semiconductor device (what is called an assembly)). Subsequently, the substrate 2 is cut along cutting lines 18 and divided into smaller substrates 2 comprising respective semiconductor elements 3 to be commercialized.

The substrate 2 may be a lead frame made of metal (Cu or Fe—Ni) or a multilayered substrate (organic substrate or ceramic substrate).

Now, with reference to FIGS. 3A to 3E, 4A, 4B, 5A to 5C, and 2A and 2B, a description will be given of a method for manufacturing the resin molding semiconductor device 1.

Figure 3A:
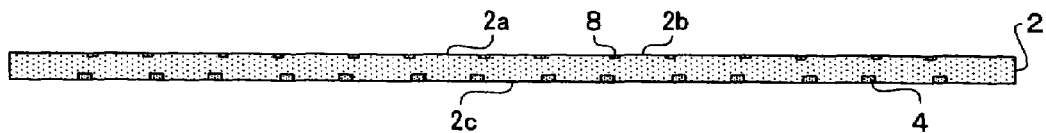
FIGS. 3A to 3E are sectional views showing steps for manufacturing the resin molding semiconductor device.

First, an electrode 8 is formed in the front surface portion 2a of the substrate 2 having the chip mounting area 2b, in which the semiconductor element 3 is mounted, at a position around the outer periphery of the chip mounting area 2b. Eternal elements 4 are formed on a back surface portion 2c of the substrate 2. FIG. 3A shows that the chip mounting area 2b, electrode 8, and external terminals 4 have already been formed on the substrate 2.

A step of forming external terminals 4 may follow a resin molding process described below.

Figure 3B:
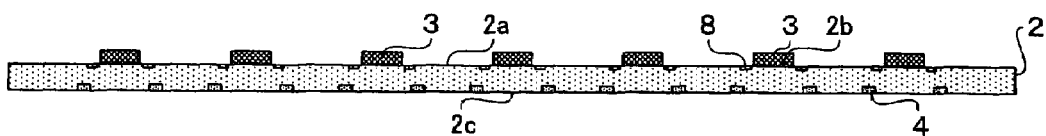
Figure 3C:
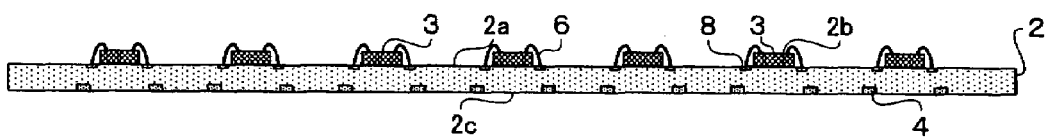

Now, as shown in FIG. 3B, the semiconductor element 3 with the electrode (not shown) is mounted in and secured to the chip mounting area 2b of the substrate 2. Then, as shown in FIG. 3C, the electrode 8 on the substrate 2 is electrically connected to the electrode on the semiconductor element 3 via a wire 6.

Figure 3D:
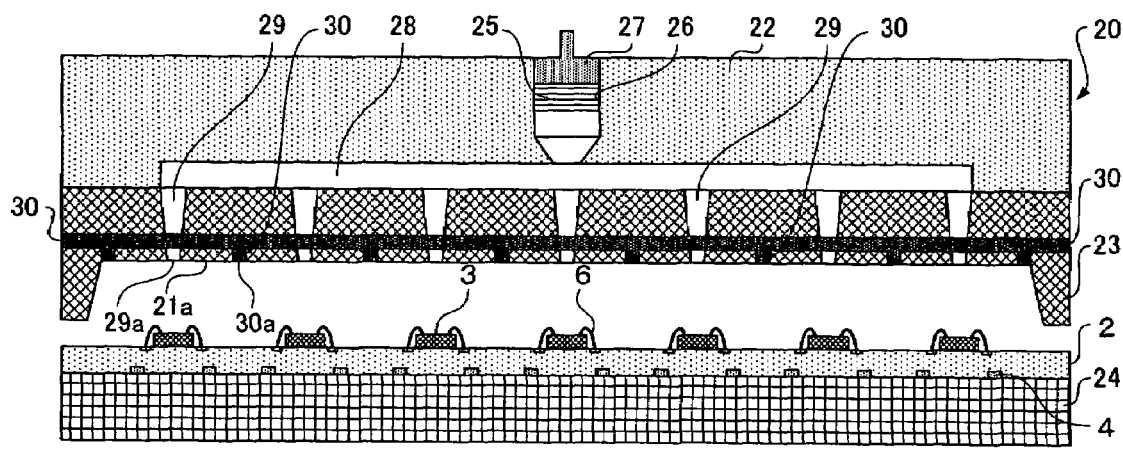
Figure 3E:
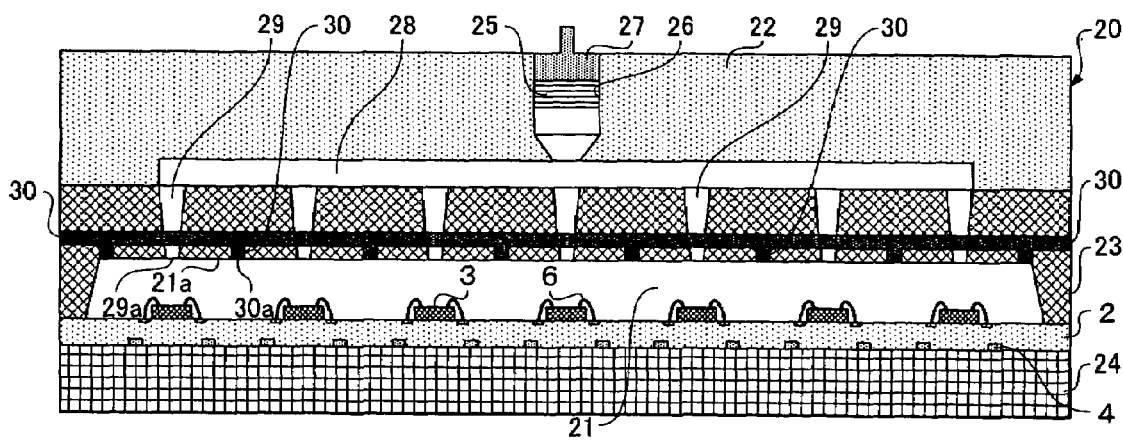

Subsequently, resin molding is performed. Here, FIGS. 2B, 3D, and 3E schematically show how resin molding is performed on the substrate 2. The substrate 2 with the semiconductor element 3 mounted thereon is placed, before resin molding, in a production equipment for resin molding. The production equipment comprises a resin molding mold 20 having a cavity 21 that is a molding resin injection space. The mold 20 is divided into an upper mold 22, an intermediate mold 23, and a lower mold 24. The upper mold 22 and the intermediate mold 23 are disposed so as to be able to elevate and lower relative to the lower mold 24.

The upper mold 22 has a collecting portion (what is called a pot) 26 in which a molding resin 25 is temporarily collected, a plunger 27 that is movable forward and backward to push out the molding resin 25 collected in the collecting portion 26, and a runner 28 constituting a path through which the molding resin 25 is pushed out. The intermediate mold 23 has a gate 29 that is a path through which the molding resin 25 fed through the runner 28 is introduced into each cavity 21, and an air discharge passage 30 through which air from the cavity is released during resin injection. A port of the gate 29 which communicates with the cavity 21 is a resin injection port 29a. A port of the air discharge passage 30 which communicates with the cavity 21 is an air release port 30a.

As shown in FIG. 3E and other figures, the cavity 21 constitutes a single large space, whereas a plurality of resin injection ports 29a and a plurality of air release ports 30a are formed in association with the respective semiconductor elements 3. As shown in FIGS. 3D and 3E, the resin injection port 29a and the air release port 30a are located opposite the cavity 21 and formed in a top surface portion 21a of the cavity 21 which is located opposite the front surface portion 2a of the substrate 2. Although not shown, the resin injection port 29a is formed in a central portion of the top surface portion 21a of the cavity 21 (above a central portion of the semiconductor element 3) in a plan view in which the device is viewed in the thickness direction of the substrate 2 and the molding resin 7. Further, for example, a plurality of air release ports 30a are dotted, in a plan view, in the top surface portion 21a of the cavity 21 in the vicinity of the resin injection port 29a. Moreover, as shown in FIG. 2A, the air release ports 30a are formed on cutting lines 18 used to divide the substrate 2 and the molding resin portion 7 into pieces.

Figure 4A:
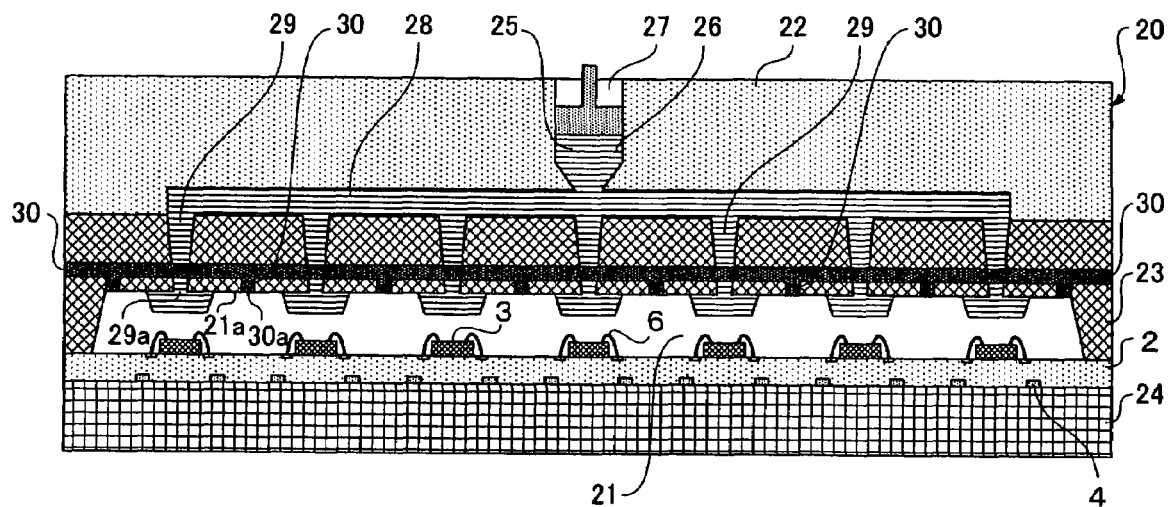
FIGS. 4A and 4B are sectional views showing steps for manufacturing the resin molding semiconductor device.
Figure 4B:
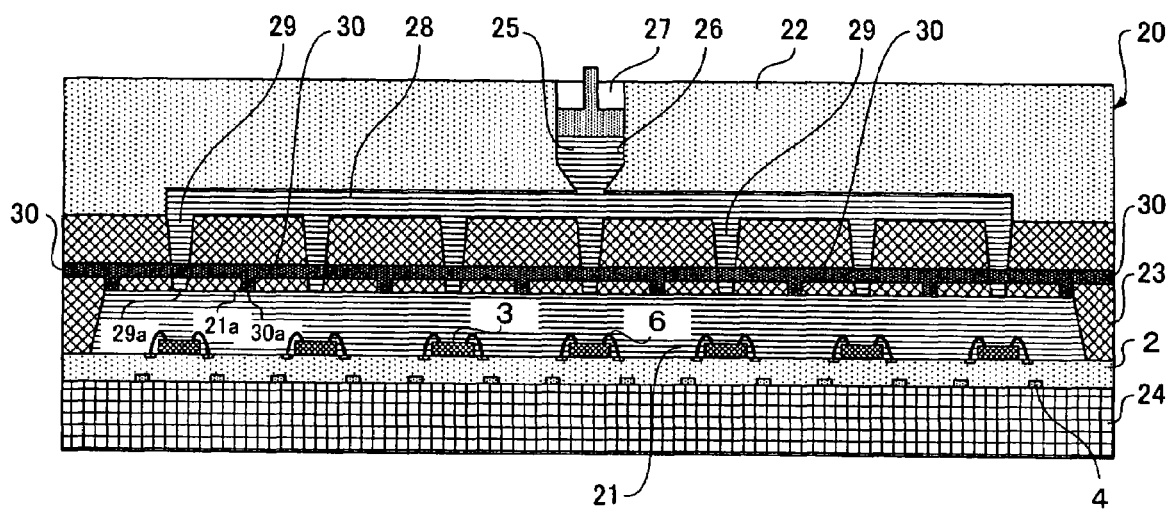

The mold 20 having the above structure is used for the process. First, as shown in FIG. 3D, the substrate 2 with the semiconductor element 3 mounted thereon is placed on the lower mold 24. The intermediate mold 23 and the upper mold 22 are then lowered. As shown in FIGS. 3E, 4A, and 4B, with the space of the cavity 21 formed, the plunger 27 is pushed in to inject the molding resin 25. This allows the molding resin 25 to flow into the cavity 21 through the resin injection port 29a, formed in the top surface portion 21a of the cavity 21, while releasing air from the air release ports 30a, formed in the top surface portion 21a of the cavity 21, and from the air discharge path 30. The molding resin 25 (molding resin portion 7) thus covers the front surface portion 2a of the substrate 2, the semiconductor element 3, and the wire 6 for batch molding.

To inject the molding resin 25, a thermosetting epoxy resin (tablet) is introduced and melted in the collecting portion 26 of the mold 20 heated to 120 to 200° C. and is then ejected using the plunger 27. The ejected molding resin 25 passes through the runner 28 and is then injected into a product portion (cavity 21) through the resin injection port 29a of the gate 29. The injected molding resin 25 is hardened in a predetermined hardening time (30 to 120 seconds).

Figure 5A:
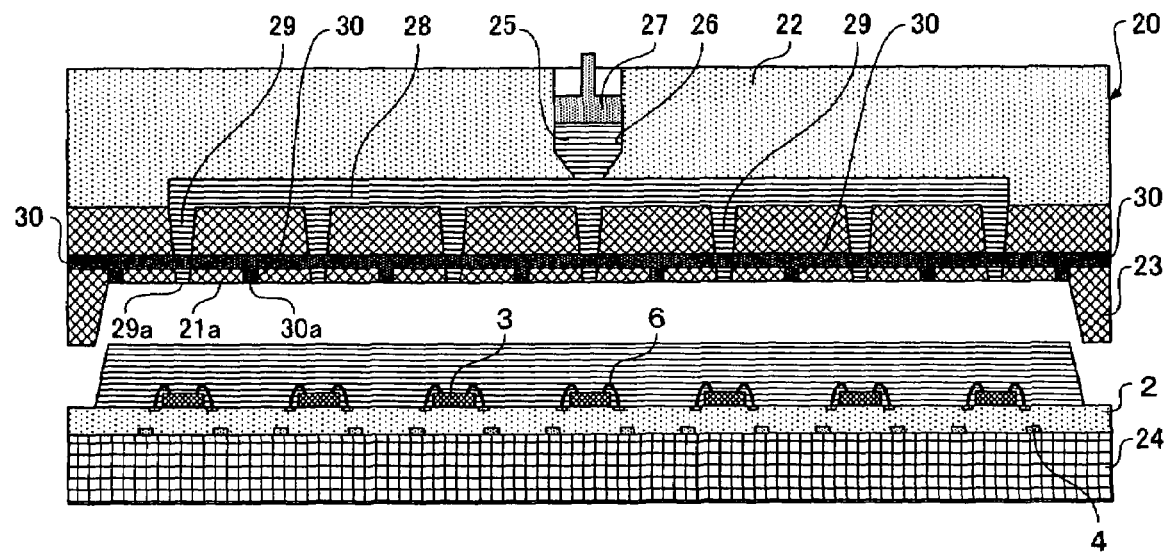
FIGS. 5A to 5C are sectional views showing steps for manufacturing the resin molding semiconductor device.
Figure 5B:
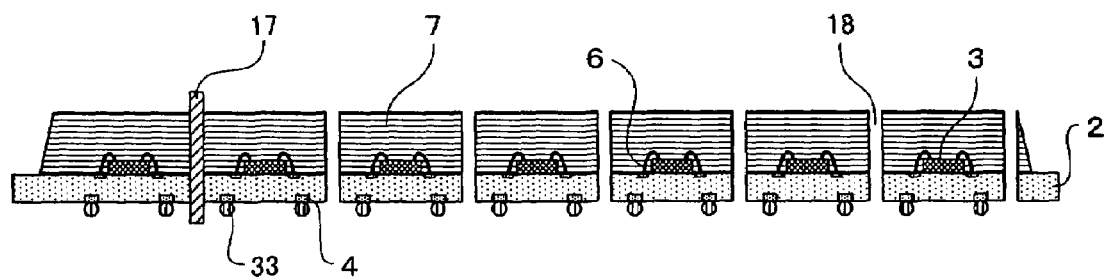
Figure 5C:
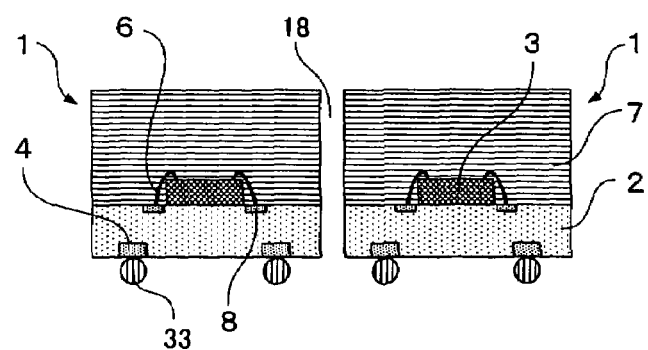

After the molding resin 25 hardens, as shown in FIG. 5A, the intermediate mold 23 and the upper mold 22 are elevated to remove the substrate 2 molded with the resin. As shown in FIGS. 5B and 5C, a cutter 17 such as a dicing saw is used to cut the substrate 2 and the resin molding portion 7 along cutting lines 18 to form individual resin molding semiconductor devices 1. Solder balls 33, bumps, or the like may be disposed at the external terminals 4 provided on the back surface portion 2c of the substrate 2. Alternatively, the external elements 4 themselves may be formed in this stage.

This allows the resin molding semiconductor devices 1 to be manufactured. In this case, during the resin molding process, the molding resin 25 is injected from the resin injection port 29a, formed in the top surface portion 21a of the cavity 21. Even when the molding resin 25 is injected, only a small amount of molding resin 25 flows along the front surface portion 2a of the substrate 2. Thus, even if the wire 6 is used as a connector connecting the electrode 8 on the substrate 2 to the three electrodes on the semiconductor element, the wire 6 can be prevented from being swept away by the molding resin 25 and contacting the adjacent wire 6.

Thus, the molding rein 25 is molded by the top (top surface portion) of that area of the cavity 21 which corresponds to the resin molding semiconductor device 1. This is what is called a top gate scheme, and when for example, the electrode on the semiconductor element 3 is joined to the electrode of the substrate 2 via a thin metal line (wire 6), the top gate scheme is very effective for reducing wire sweep of the wire 6 (made of Au or Al). In particular, if the semiconductor element 3 is a multifunctional LSI, the number of the wire 6 is several hundred to several thousand and the length thereof is 5 to 8 mm. The wires 6 also have a very small wire diameter of 18 to 30 μm. The present embodiment, in which the entire resin molding portion 7 is molded at a time, requires a large resin molding area. Accordingly, it is important to appropriately arrange the resin injection ports (gates) 29a. In the present embodiment, to minimize the wire sweep resulting from the flow of the molding resin 25, each of the resin injection ports (gates) 29a is located above the center of the corresponding semiconductor element 3 in a plan view. This reduces the wire weep, improving reliability.

In particular, the above configuration adopts the technique for injecting the molding resin 25 from the resin injection ports 29a, formed in the top surface portion (top) of the cavity 21 in association with the respective semiconductor elements 3. Further, the air release ports 30a, from which the air in the cavity 21 is discharged (released), are dotted, in a plan view, in the top surface portion 21a of the cavity 21 in the vicinity of the corresponding resin injection port 29a. This configuration enables a sharp reduction in the distance between the resin injection port 29a and the air release port 30a compared to the conventional configuration discharging the air in the cavity from the side surface of the cavity which is located along the substrate surface. This makes it possible to inhibit air from being mixed in the resin molding portion 7 during resin injection, minimizing the likelihood that an internal void occurs in the resin molding portion 7. Thus, the area of the resin molding portion (an assembly of the parts corresponding the final resin molding portions 7) that can be molded with resin at a time can be increased, allowing more resin molding semiconductor devices 1 to be produced at a time. As a result, productivity can be improved.

Further, during the resin molding process, the molding resin 25 is injected from each resin injection port 29a, and air in the cavity 21 is discharged from each air release port 30a. After the air in the cavity 21 is discharged, the molding resin 25 flows out from the air release port 30a. In this case, as shown in FIG. 1C, a resin burr is formed in an area corresponding to the air release port 30a, as an air release port impression 10. A resin burr may also be formed in an area corresponding to the resin injection port 29a, as a resin injection port impression 9.

However, even if the resin burr remains in the area corresponding to the air release port 30a, as the air release port impression 10, the air release port impression 10 is formed on a dividing line 18, in the present embodiment, on the corresponding intersection between the dividing lines, during a subsequent dividing process, and the areas corresponding to the dividing lines 18 are cut away during the division. Thus, as shown in FIG. 1A, only a few burrs shaped like almost quarter circles, in a plan view, remain in the corners of the molding resin portion 7. This makes it possible to make the depressions in the product unnoticeable. Further, fitting the size of the air release port 30a within the width of the cut area of the dividing line 18 makes it possible to prevent the appearance of the product from being affected.

Figure 6A:
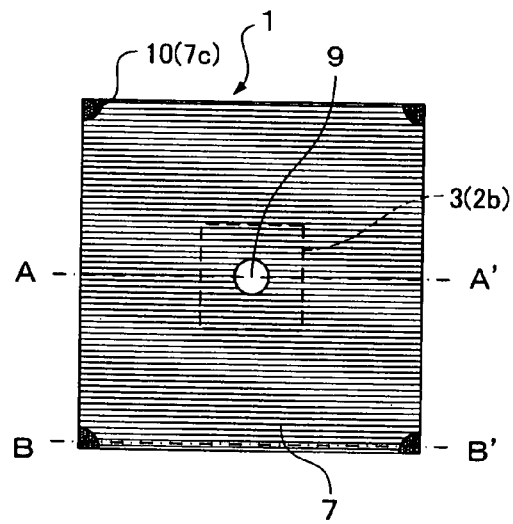
Figure 6B:
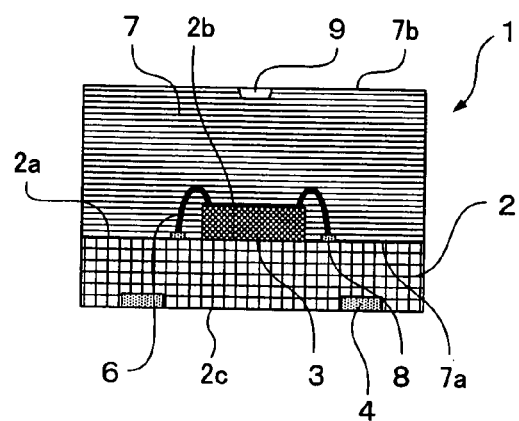
Figure 6C:
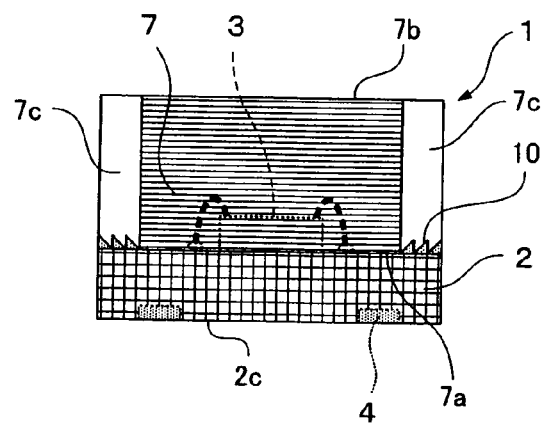

FIGS. 6A to 6C show a resin molding semiconductor device manufactured by a method and production equipment for manufacturing a resin molding semiconductor device in accordance with a second embodiment of the present invention. FIG. 6A is a plan view of the resin molding semiconductor device. FIG. 6B is a simplified sectional view of the resin molding semiconductor device taken along line A-A' in FIG. 6A. FIG. 6C is a simplified sectional view of the resin molding semiconductor device taken along line B-B' in FIG. 6A. This resin molding semiconductor device is the same as the resin molding semiconductor device 1 shown in FIGS. 1A to 1C except for the position where the air release impression 10 is formed and its shape. The difference will be described below.

As shown in FIGS. 6A to 6C, in the resin molding semiconductor device 1, recessed potions 7c are formed in areas of the molding resin portion 7 which constitute corners in a plan view; the recessed portions 7c are recessed from the top surface portion of the molding resin portion 7 to the vicinity of the top surface portion 2a of the substrate 2. The air release port impression 10 from which air is released during resin injection is present at the bottom of each of the recessed portion 7c. The resin injection port impression 9 with the molding resin injected therein is present in the top surface portion 7b (what is called the top surface) of the molding resin portion 7 as is the case with the above embodiment.

In the present embodiment, the recessed portion 7c, recessed from the top surface portion 7b of the molding resin portion 7, is exposed from a side surface of the molding resin portion 7 and shaped like an almost quarter circle in a plan view. The side surface portion of the molding resin portion 7 except for the recessed portions 7c is substantially flush with a side surface portion of the substrate 2.

Figure 8A:
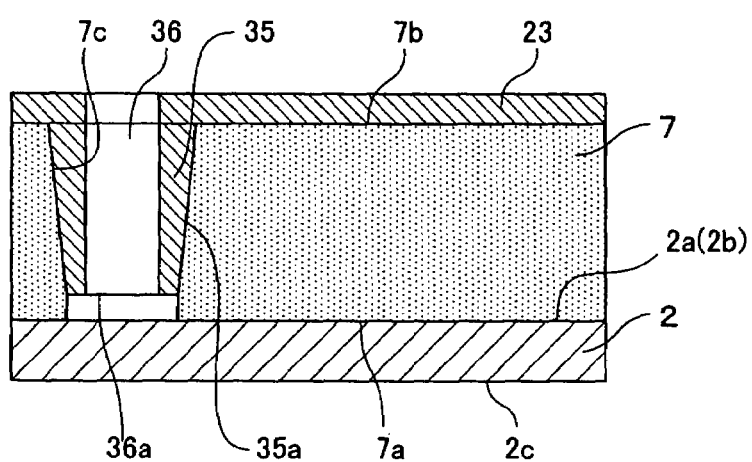
FIGS. 8A and 8B are a sectional view of an essential part of a step of manufacturing the resin molding semiconductor device with pins installed therein and a perspective view of the pin, respectively.
Figure 8B:
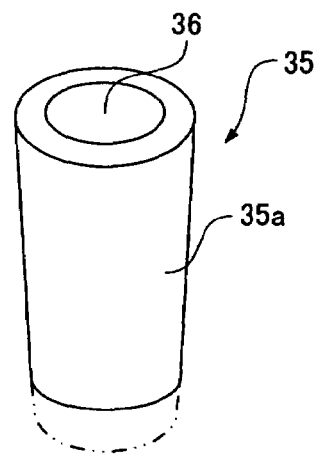

A production equipment used for a resin molding process for the resin molding semiconductor device 1 has not only the structure shown in FIGS. 2A to 4B, described above, but also a hollow pin 35 additionally secured to a bottom surface of the intermediate mold 23 as auxiliary intermediate mold as shown in FIG. 7B. The pin 35 is disposed so as to extend from the top surface portion 21a of the cavity 21 to the vicinity of the front surface portion 2a of the substrate 2 and through the cavity 21. An air releasing passage 36 (see FIGS. 8A and 8B) penetrating each pin 35 in the axial direction of the pin is joined to the air discharge path 30 in the intermediate mold 23. An area corresponding to a lower end surface of the air releasing passage 36 constitutes an air release port 36a. In the present embodiment, as shown in FIGS. 8A and 8B, a draft-angle inclined surface 35a is formed around an outer peripheral surface of the pin 35 and is tapered downward so that the cross section in the outer peripheral surface decreases as it approaches the front surface portion 2a of the substrate 2. This allows the pin 35 to be easily removed after the resin molding process. Further, the recessed portion 7c (and thus the pin 35, forming the recessed portion 7c) is formed and located so as to overlap the dividing line 18 for the subsequent dividing process.

The mold 20 configured as described above is used for resin molding. Then, as shown in FIGS. 6C, 8A, and 8B, the recessed portions 7c, which are recessed toward the bottom surface portion 7a, are formed in the top surface portion 7b of the molding resin portion 7. The air release port impression 10, from which air is released during resin injection, is present at the bottom of each of the recessed portions 7c. The resin injection port impression 9 with the molding resin injected therein is present on the top surface portion 7b (what is called the top surface) of the molding resin portion 7 as is the case with the above embodiment.

The above manufacturing method and arrangement also enable a sharp reduction in the distance between the resin injection port 29a and the air release port 30a compared to the conventional method and arrangement discharging the air in the cavity from the side surface of the cavity which is located along the substrate surface. This makes it possible to inhibit air from being mixed in the resin molding portion 7 during resin injection, minimizing the likelihood that an internal void occurs in the resin molding portion 7. Thus, the area of the resin molding portion (an assembly of the parts corresponding the final resin molding portions 7) that can be molded with resin at a time can be increased, allowing more resin molding semiconductor devices 1 to be produced at a time. As a result, productivity can be improved.

Further, according to the present manufacturing method and arrangement, the recessed portion 7c of the molding resin portion 7 is disposed to overlap the dividing line 18 as shown in FIGS. 7A and 7B. Consequently, the resin molding semiconductor device 1 formed into a product has the recessed portions 7c in the corners of the molding resin portion 7, as shown in FIGS. 6A to 6C, increasing the mechanical intensity of the corners of the molding resin portion 7. Thus, when the substrate is divided into pieces using a cutter 17 such as a dicing saw during the dividing step, the above arrangement reduces the splash of part of the molding resin 25 (package crack), which may occur at the end of the cutting with the cutter 17. In the areas of the molding resin portion 7 other than the recessed portions 7c, the resin side surface of the resin molding semiconductor device 1 is substantially flush with the substrate side surface.

In the above arrangement, the draft-angle inclined surface 35a is formed around the outer peripheral surface of each pin 35. This allows the pin 35 to be easily removed during mold releasing after the resin molding process, improving the working efficiency during a releasing step.

Figure 8C:
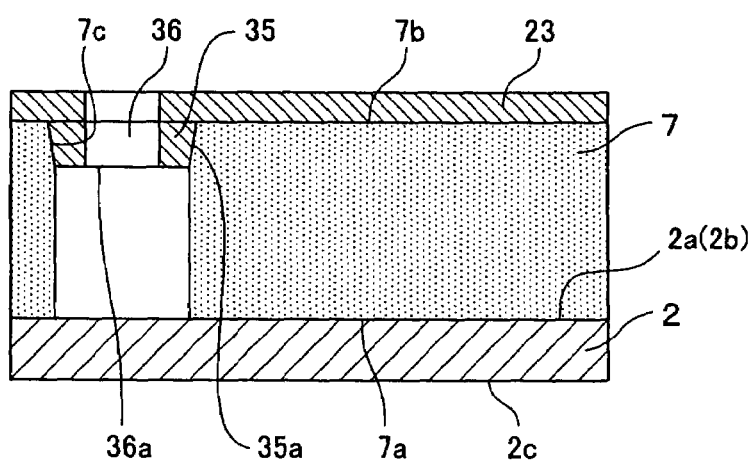
FIGS. 8C and 8D are a sectional view of an essential part of a step of manufacturing another example of resin molding semiconductor device with pins installed therein and a perspective view of the pin, respectively.
Figure 8D:
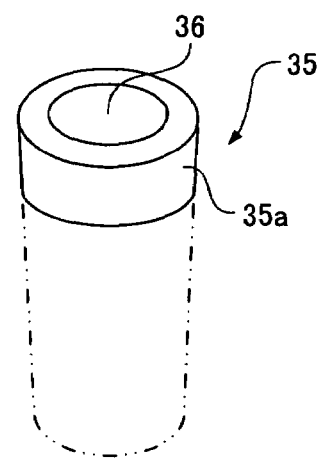
Figure 9A:
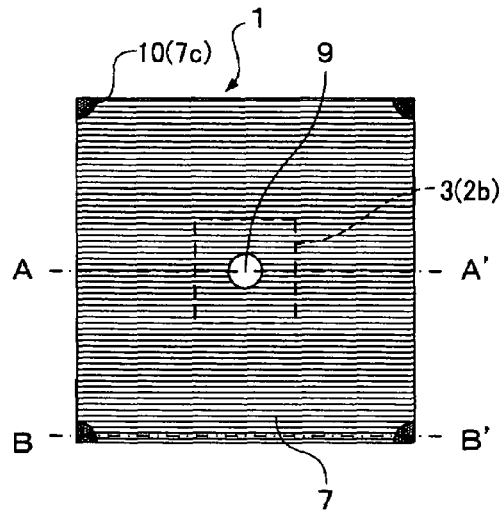
Figure 9B:
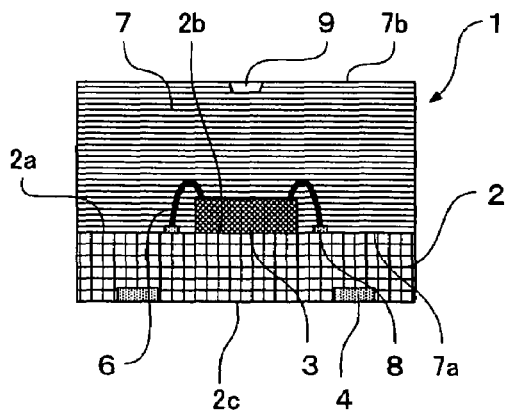
Figure 9C:
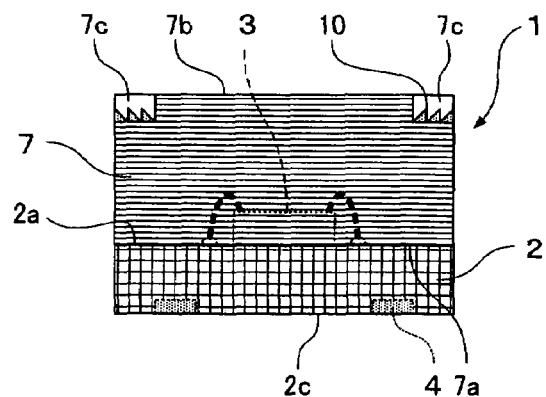

Instead of the pin 35, which is long enough to extend to the vicinity of the front surface portion 2a of the substrate 2 as shown in FIGS. 8A and 8B, a shorter pin 35 such as the one shown in FIGS. 8C and 8D may be used. In this case, as shown in FIGS. 9A to 9C, a shallow recessed portion 7c is formed in each of the corners of the molding resin portion 7. The air release port impression 10, from which air is released during resin injection, is present at the bottom of the recessed portion 7c.

Figure 11C:
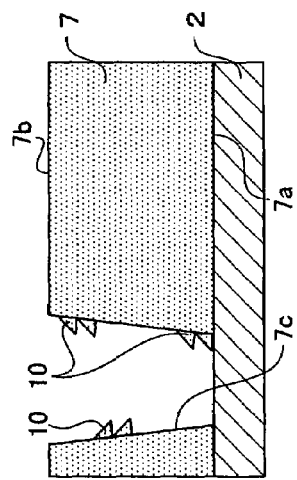
FIGS. 11C, 11F, and 11I are each a sectional view of a variation of the resin molding semiconductor device molded with resin and from which the pin has been removed.
Figure 11F:
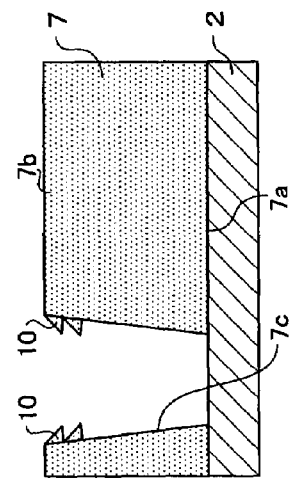
Figure 11I:
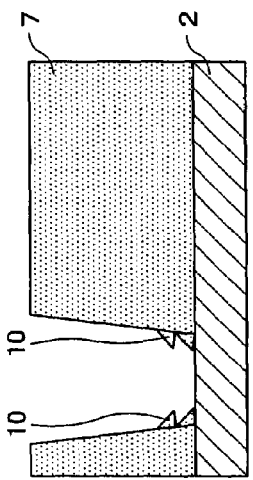
Figure 11B:
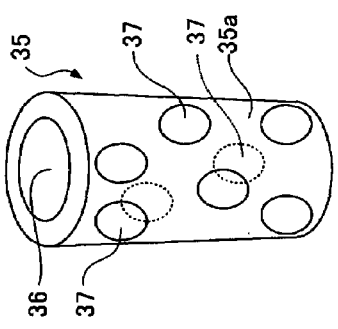
FIGS. 11B, 11E, and 11H are each a perspective view of the pin.
Figure 11E:
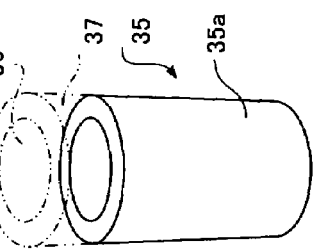
Figure 11H:
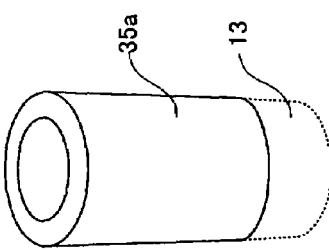
Figure 11A:
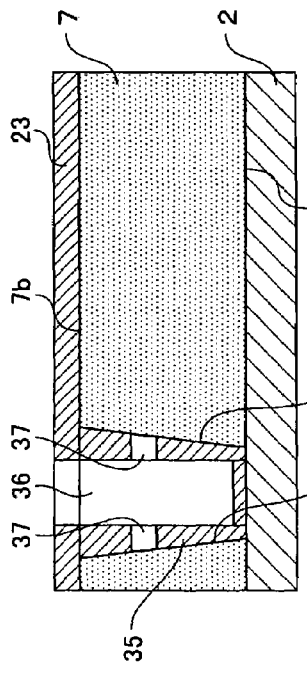
FIGS. 11A, 11D, and 11G are each a sectional view of another variation of the resin molding semiconductor device with the pin installed therein.
Figure 11D:
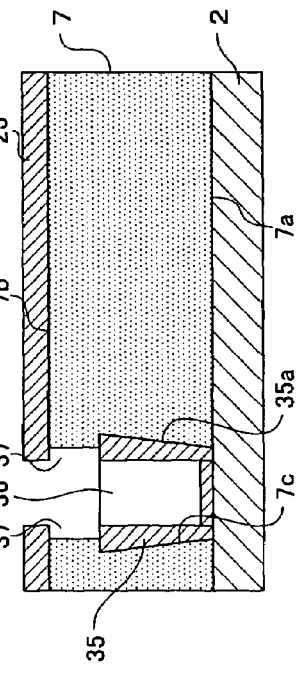
Figure 11G:
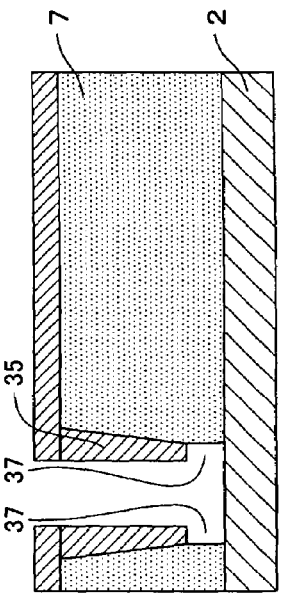

Alternatively, the production equipment used for the resin molding process for the resin molding semiconductor device 1 may use the pin 35 with its side surface portion partly notched to form air release ports 37 as shown in FIGS. 10A to 10I and 11A to 11I. That is, as shown in FIGS. 10A to 10C, a plurality of round hole-shaped air release ports 37 (or one air release port 37) (the shape of the hole is not limited to this) may be formed in an upper portion of the pin 35 so as to communicate with the air releasing passage 36. Alternatively, as shown in FIGS. 10D to 10F, a plurality of round hole-shaped air release ports 37 (or one air release port 37) (the shape of the hole is not limited to this) may be formed in an intermediate portion of the pin 35 so as to communicate with the air releasing passage 36. Alternatively, as shown in FIGS. 10G to 10I, a plurality of round hole-shaped air release ports 37 (or one air release port 37) (the shape of the hole is not limited to this) may be formed in a lower portion of the pin 35 so as to communicate with the air releasing passage 36. Alternatively, as shown in FIGS. 11A to 11C, a plurality of round hole-shaped air release ports 37 (the shape of the hole is not limited to this) may be formed all over the pin 35, that is, from the upper to lower portions of the pin 35, so as to communicate with the air releasing passage 36. Alternatively, as shown in FIGS. 11D to 11I, a notched groove-shaped air release port 37 may be formed all over the upper or lower portion of the pin 35 so as to communicate with the air releasing passage 36. Also in this case, a drat angle inclined surface 35a is preferably formed which allows the pin 35 to be easily removed after the resin molding process.

Figure 12A:
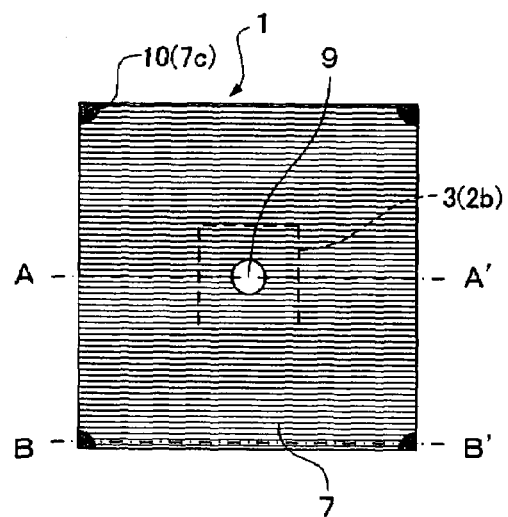
Figure 12B:
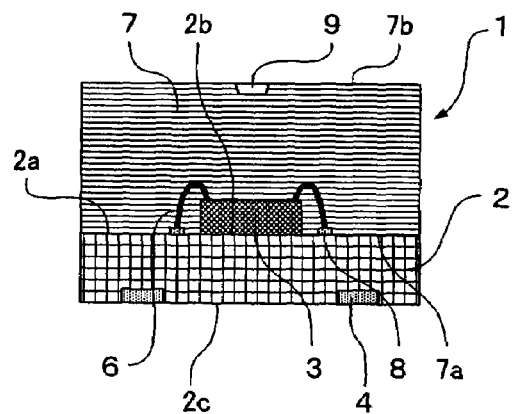
Figure 12C:
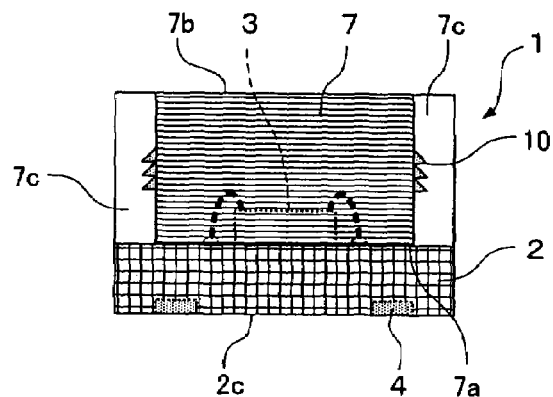

FIGS. 12A to 12C shows the resin molding semiconductor device 1 manufactured using the pin 35 shown in FIGS. 10A to 10C. In this resin molding semiconductor device 1, the air release port impression 10, from which air is released during resin injection, is present in an intermediate area of the molding resin portion 7 in a thickness direction thereof which corresponds to the air release port 37 formed in the intermediate portion of the pin 35.

The production equipment configured as described above method also enables a sharp reduction in the distance between the resin injection port 29a and the air release port 30a compared to the conventional production equipment discharging the air in the cavity from the side surface of the cavity which is located along the substrate surface. This makes it possible to inhibit air from being mixed in the resin molding portion 7 during resin injection, minimizing the likelihood that an internal void occurs in the resin molding portion 7. Thus, the area of the resin molding portion that can be molded with resin at a time can be increased, allowing more resin molding semiconductor devices 1 to be produced at a time. As a result, productivity can be improved.

If the air release port 37 is formed in the intermediate portion of the pin 35, then during resin molding, air escapes through a substantially intermediate portion of the molding resin portion 7 in its thickness direction of the portion 7. Thus, during resin molding, air is appropriately emitted from the central portion of the molding resin portion 7, where air is most unlikely to escape. This enables inhibition of possible internal voids caused by remaining air.

In the above embodiment, the illustrated pin 35 is cylindrical. However, the pin 35 need not necessarily be cylindrical but may be shaped like a square or triangle pole which has a polygonal cross section. Also in this case, as described above, the pin 35 preferably has the draft-angle inclined surface 35a on a side surface thereof which is inclined so that its cross section decreases as the inclined surface starts from the intermediate mold 23 (the top surface of the pin 35) and approaches the front surface portion (the bottom surface of the pin 35) to allow the pin 35 to be easily removed in removing the mold after resin molding. Further, if hole-shaped air release ports 37 are formed in a partial area of the cylindrical pin 35, the hole-shaped air release ports 37 may be formed at the respective positions all along the circumference of the pin 35. However, the number of holes and their opening areas are desirably adjusted so as to suit the air discharge condition during resin molding.

In all the above embodiments, only the air release ports 30a, 36a, and 37 and air releasing passage 36 are arranged to overlap the dividing lines 18. However, the present invention is not limited to this. As shown in FIGS. 13A and 13B, not only the air release ports 30a but also the resin injection ports 29a may be located to overlap the dividing lines 18. In the third embodiment, the gates 29 and the air discharging passage 30 are disposed so that in a plan view, the resin injection port 29a is positioned in a central portion of an area in which four resin molding semiconductor devices 1 are finally manufactured, with the air release ports 30a dotted around the resin injection port 29a. The thus configured production equipment is used for resin molding to manufacture the resin molding semiconductor device 1 through a manufacturing process similar to that shown in FIGS. 3A to 5C. However, in the dividing step, the area of the air release port impression 10 and the area of the resin injection port impression 9 are each formed on the corresponding intersection between the dividing lines 18, used to divide the substrate 2 and the molding resin portion 7 into pieces; the area of the air release port impression 10 corresponds to the air release port 30a and the area of the resin injection port impression 9 corresponds to the resin injection port 29a.

Figure 14A:
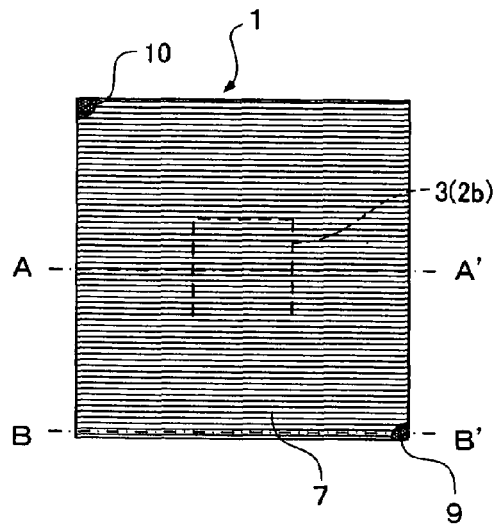
FIG. 14A is a plan view of a resin molding semiconductor device (not divided yet) manufactured by a method and production equipment for manufacturing a resin molding semiconductor device in accordance with a third embodiment of the present invention.
Figure 14B:
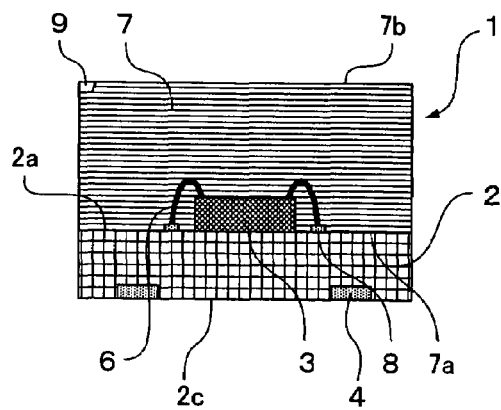
FIG. 14B is a simplified sectional view of the resin molding semiconductor device taken along line A-A' in FIG. 14A.
Figure 14C:
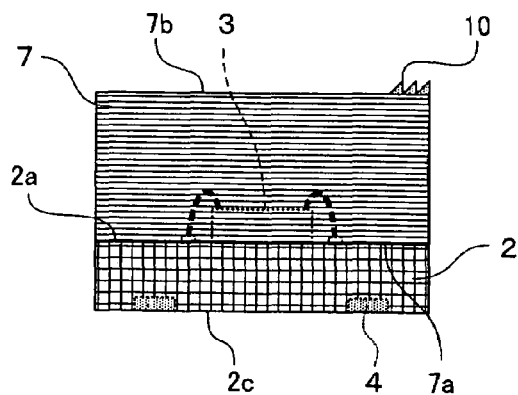
FIG. 14C is a simplified sectional view of the resin molding semiconductor device taken along line B-B' in FIG. 14A.

This manufacturing method manufactures the resin molding semiconductor device 1 having the air release port impression 10, corresponding to the air release port 30a, or the resin injection port impression 9, corresponding to the resin injection port 29a, in corners of the molding resin portion 7 in a plan view, as shown in FIGS. 14A to 14C.

The production equipment configured described above is used to manufacture the resin molding semiconductor device 1. The production equipment thus enables a sharp reduction in the distance between the resin injection port 29a and the air release port 30a compared to the conventional production equipment discharging the air in the cavity from the side surface of the cavity which is located along the substrate surface. This makes it possible to inhibit air from being mixed in the resin molding portion 7 during resin injection, minimizing the likelihood that an internal void occurs in the resin molding portion 7. Thus, the area of the resin molding portion that can be molded with resin at a time can be increased, allowing productivity to be improved. In this case, the pin 35 may be used for manufacturing as an auxiliary intermediate mold, similarly to the above embodiments.

Further, the resin molding semiconductor device 1 manufactured by the above production equipment and method has the air release port impression 10 or the resin injection port impression 9 in a corner thereof. This is effective for preventing the splash of part of the molding resin (package crack), which may occur at the end of cutting with the cutter 17 such as a dicing blade of a dicing saw as described above. Furthermore, changing the design of a cutting width for division allows no depression to be left in the individual resin molding semiconductor devices 1 resulting from the division. As shown in the present embodiment, unlike the first embodiment, the resin injection port 29a need not necessarily be located above the center of the molding resin portion 7 or semiconductor element 3. This is because if the resin molding semiconductor device 1 has a small external size, the above wire sweep is not so problematic as described above if a sufficiently small number or length of wires 6 (for example, several to several tens of wires) are used to connect the semiconductor element 3 to the electrode 8 on the substrate 2.

Now, a description will be given of a production equipment manufacturing a resin molding semiconductor device in accordance with a fourth embodiment of the present invention.

FIG. 15A is a plan view showing an assembly of resin molding semiconductor devices 1 manufactured by the production equipment for manufacturing a resin molding semiconductor device. FIG. 15B is a sectional view schematically showing how the assembly of resin molding semiconductor devices 1 is manufactured. In the production equipment manufacturing a resin molding semiconductor device as shown in FIG. 2B, the air discharging paths 30 extending upward from the respective air release ports 30a are connected to the common laterally extending air discharge passage 30. Instead, in the production equipment manufacturing a resin molding semiconductor device as shown in FIGS. 15A and 15B, each of the air release ports 30a is connected to the corresponding independent vertically-extending air discharge passage 30 to allow air to escape from the top of the air discharge passage 30 (the intermediate mold 23 and the upper mold 22 have the air discharge passages 30 penetrating the molds in the vertical direction so that the molds are in communication with each other). This configuration advantageously allows the air discharge passages 30 to be individually cleaned even if the passages are clogged with resin residues during ventilation. That is, air vents are likely to be clogged with resin residues, but the present embodiment allows the air discharge passages 30 to be individually easily cleaned.

FIG. 16A is a plan view showing an assembly of resin molding semiconductor devices 1 manufactured by the production equipment for manufacturing a resin molding semiconductor device in accordance with a variation of the fourth embodiment of the present invention. FIG. 16B is a sectional view schematically showing how the assembly of resin molding semiconductor devices 1 is manufactured. According to the present embodiment, as shown in FIGS. 16A and 16B, the production equipment manufacturing a resin molding semiconductor device includes the intermediate mold 23 having the air release ports 30a, air discharge passages 30A corresponding to the respective air release ports 30a extended upward in the intermediate mold 23 so as to penetrate the intermediate mold 23, and an air discharge passage 30B that is in communication with the upper ends of the air discharge passages 30. The upper mold 22 has an air discharge passage 30C extending upward in communication with an assembly portion of the air discharge passage 30B to which all the intermediate molds 23 are assembled. When the mold 20 is disassembled into the separate intermediate molds 23, the air discharge passage 30B and an upper end thereof are exposed from the top surface of each intermediate mold 23. This configuration also advantageously allows the air discharge passage 30A or 30B in the intermediate mold 23 to be individually cleaned even if the passage is clogged with resin residues during ventilation. Further, in this production equipment, the single air discharge passage 30C, formed in the upper mold 22, connects to all the air discharge passages 30C. Thus, advantageously, a vacuum device or the like can be conveniently connected to the air discharge passage 30C to exhaust the air in the cavity 21.

FIG. 17A is a plan view showing an assembly of resin molding semiconductor devices 1 manufactured by the production equipment for manufacturing a resin molding semiconductor device in accordance with a fifth embodiment of the present invention. FIG. 17B is a sectional view schematically showing how the assembly of resin molding semiconductor devices 1 is manufactured. In the present embodiment, as shown in FIGS. 17A and 17B, the air release ports 30a are formed in a surface of the lower mold 24 which is located opposite the back surface portion 2c of the substrate 2. The air discharge passages 30 formed so as to extend downward from the air release ports 30a and through the lower mold 24. Further, air releasing through-holes 38 are formed in the substrate 2 in such a manner that each of the air discharge passages 30 joins to a lower end of the corresponding through-hole 38. The through-holes 38 in the substrate 2, the air discharge passages 30, and the air release ports 30a are finally present in the corners of each resin molding semiconductor device 1 in a plan view. That is, the through-holes 38 in the substrate 2, the air discharge passages 30, and the air release ports 30a are dotted, in a plan view, in the vicinity of the periphery of each of the resin injection ports 29a in the top surface portion 21a of the cavity 21.

Further, as shown in FIG. 17A, each of the air release ports 30a are formed on the corresponding intersection between the dividing lines 18, used to divide the substrate 2 and the molding resin portion 7 into pieces.

Figure 18A:
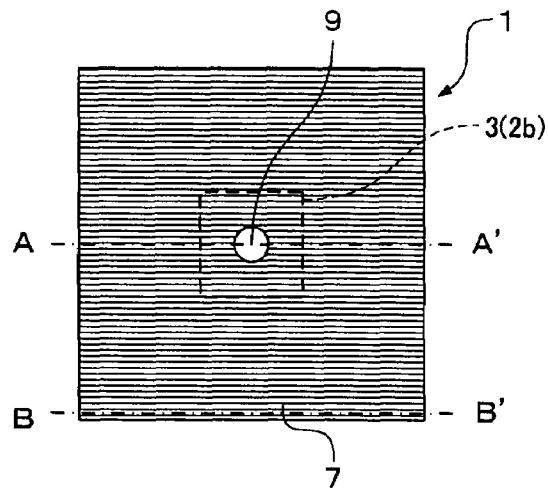
Figure 18B:
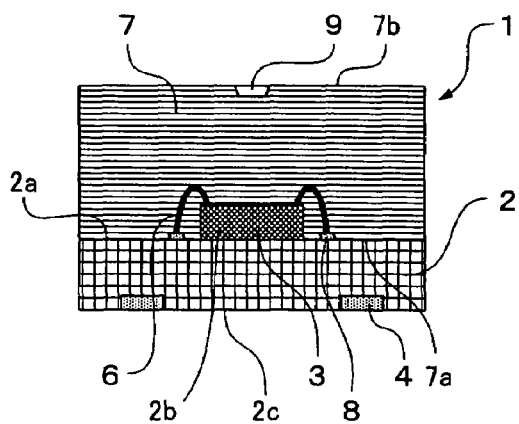
Figure 18C:
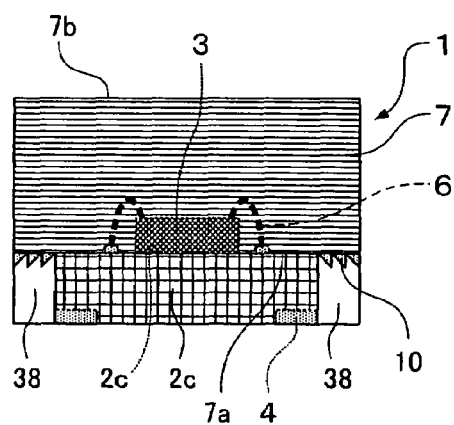

This production equipment is used to perform a resin molding operation and then a dividing operation. This allows the manufacturing of the resin molding semiconductor device 1 having through-holes 38 formed in the areas of the substrate 2 which correspond to the corners of the back surface portion of the molding resin portion 7, which appears rectangular in a plan view, the through-holes 38 penetrating the substrate 2 in its thickness direction, and the air release port impressions 10 present in the areas of the molding resin portion 7 in which the through-holes 38 in the substrate 2 are formed, air being released from the air release port impression 10 during resin injection, as shown in FIGS. 18A to 18C.

The use of this manufacturing method in the resin molding process allows the molding resin 25 to be injected and filled into the cavity 21 in the mold 20 through the resin injection ports 29a, formed in the top surface portion 21a of the cavity 21. At this time, the air in the cavity 21 is discharged through the through-holes 38, formed in the substrate 2 so as to penetrate it in its thickness direction, and through the air release ports 30a, joined to the openings, in the substrate back surface portion, of the through-holes 38 as well as the air discharge passages 30, which are continuous with the air release ports 30a. Consequently, this manufacturing method thus enables a sharp reduction in the distance between the resin injection port 29a and the air release port 30a compared to the conventional method of discharging the air in the cavity from the side surface of the cavity which is located along the substrate surface. This makes it possible to inhibit air from being mixed in the resin molding portion 7 during resin injection, minimizing the likelihood that an internal void occurs in the resin molding portion 7. Thus, the area of the resin molding portion that can be molded with resin at a time can be increased, allowing productivity to be improved.

Further, the air release port impression 10 is formed on the dividing line 18. Consequently, the areas corresponding to the dividing lines 18 are cut away during the division, leaving only a few air release port impressions in the form of almost quarter circles in the corners of the molding resin portion 7. This makes it possible to make the depressions in the product unnoticeable. Further, fitting the size of the air release port 30a within the width of the cut area of the dividing line 18 makes it possible to prevent the appearance of the product from being affected.

Even if the substrate 2 has multiple layers, the through-holes 38 may be formed as described above to appropriately release air from the bottom of the substrate. However, if the substrate 2 is a lead frame, a pin may be installed in the lower mold 24 from its bottom surface to create an air releasing passage.

Figure 19A:
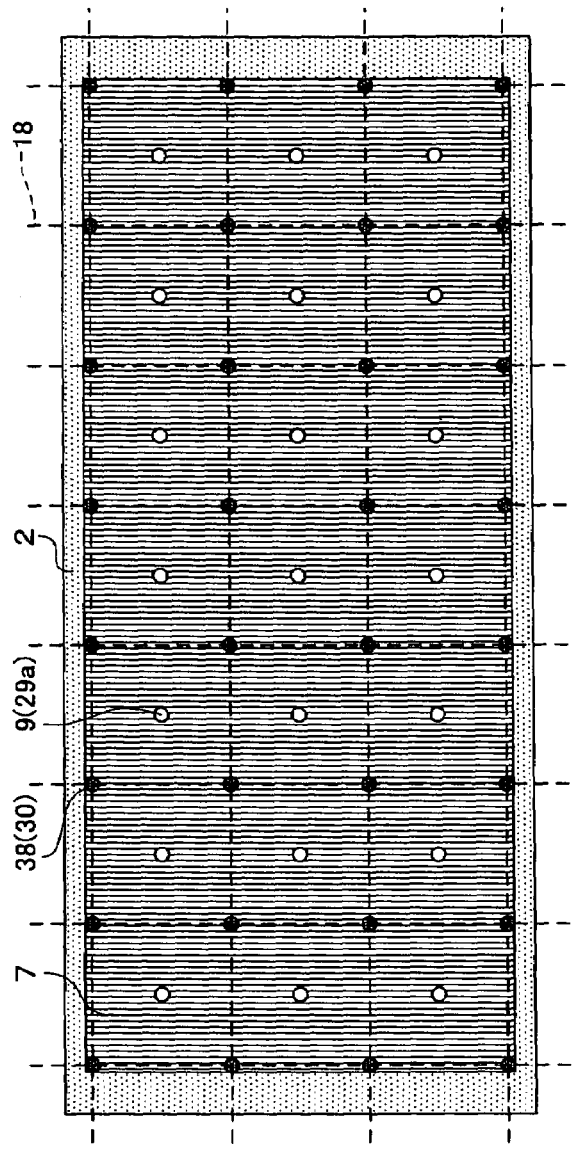
FIG. 19A is a plan view of a resin molding semiconductor device (not divided yet) manufactured by a method and production equipment for manufacturing a resin molding semiconductor device in accordance with a variation of the fifth embodiment of the present invention.
Figure 19B:
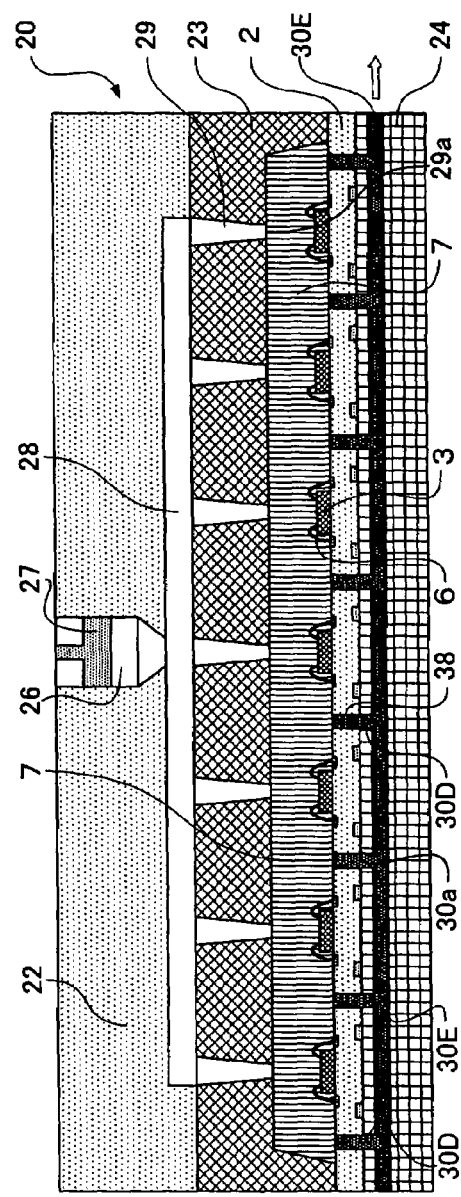
FIG. 19B is a sectional view schematically showing a step of molding the resin molding semiconductor device with resin.

In FIG. 17B, the air discharge passages 30 are formed so as to extend downward from the respective air release ports 30a to the exterior to allow air to be released downward from the bottom of each air discharge passage 30. In this case, even if the air discharge passages 30 are clogged with resin residues during exhaust, the air discharge passages 30 can advantageously be individually cleaned. However, the present invention is not limited to this. As shown in FIG. 19B, a separate air discharge passage 30E to which all air discharge passages 30D are assembled may be formed to allow concentrated exhaust.

Figure 21A:
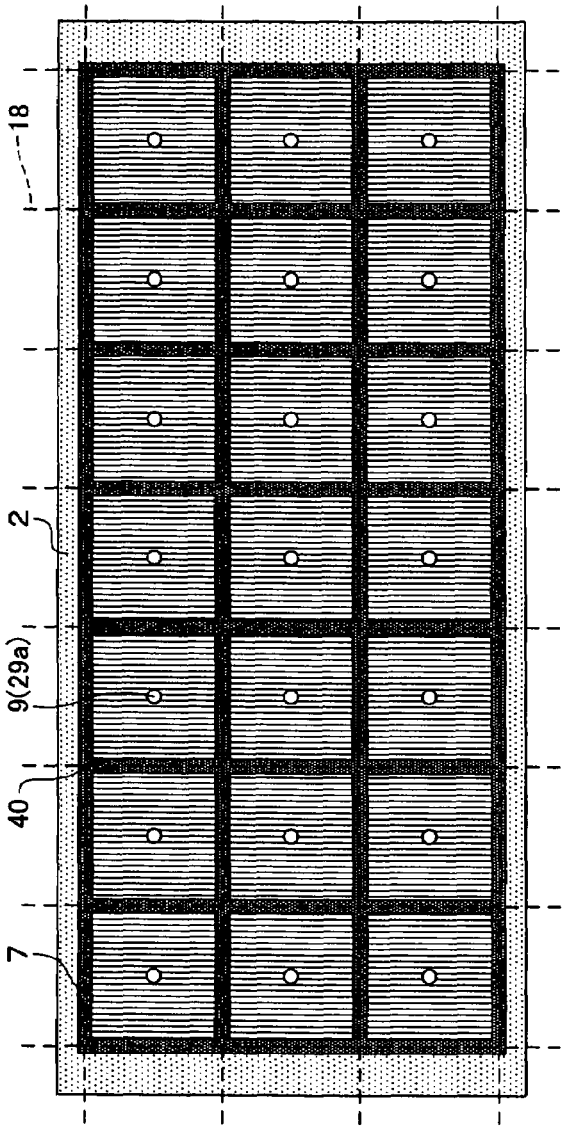
FIG. 21A is a plan view of a resin molding semiconductor device (not divided yet) manufactured by a method and production equipment for manufacturing a resin molding semiconductor device in accordance with a variation of the sixth embodiment of the present invention.
Figure 21B:
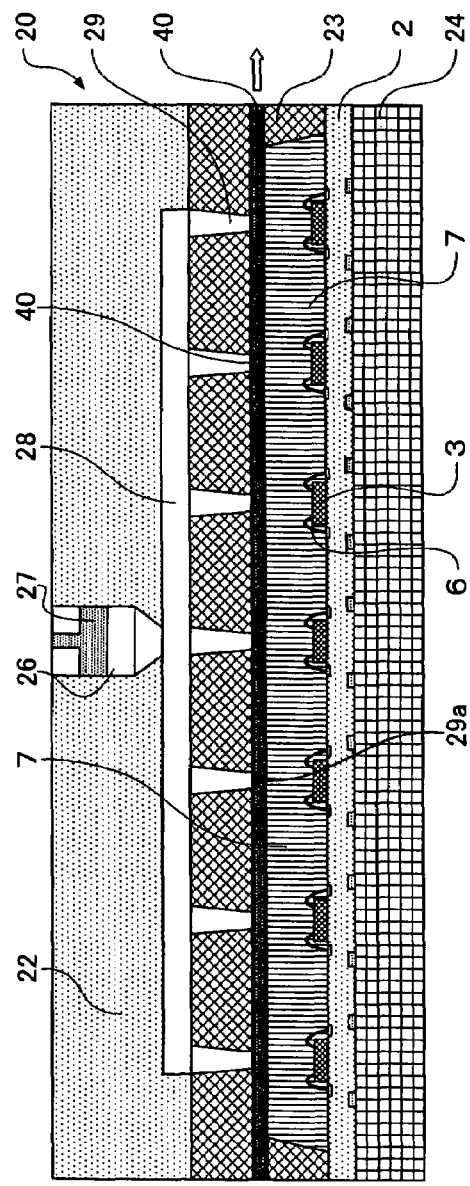
FIG. 21B is a sectional view schematically showing a step of molding the resin molding semiconductor device with resin.

FIGS. 20A and 21A are plan views showing an assembly of resin molding semiconductor devices 1 manufactured by the production equipment for manufacturing a resin molding semiconductor device in accordance with a sixth embodiment of the present invention. FIGS. 20B and 21B are sectional views schematically showing how the assembly of resin molding semiconductor devices 1 is manufactured. In the present embodiment, air release ports (air releasing passages) 40 are linearly present around the resin injection ports 29a as shown in FIGS. 20A, 20B, 21A, and 21B. Further, the linear air release ports 29a are formed on the dividing lines 18. FIGS. 20A and 20B show that the air release ports 40 are substantially parallel to each other in a plan view. FIGS. 21A and 21B show that the air release ports 40 are substantially latticed. In both cases, the air release ports 40 in the intermediate mold 23 have, for example, a recessed shape.

Figure 22A:
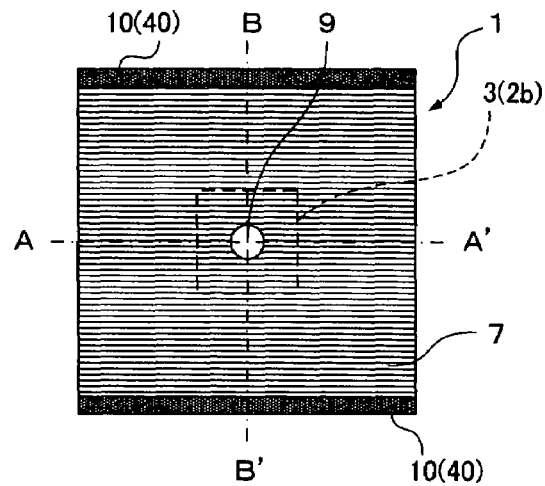
Figure 22B:
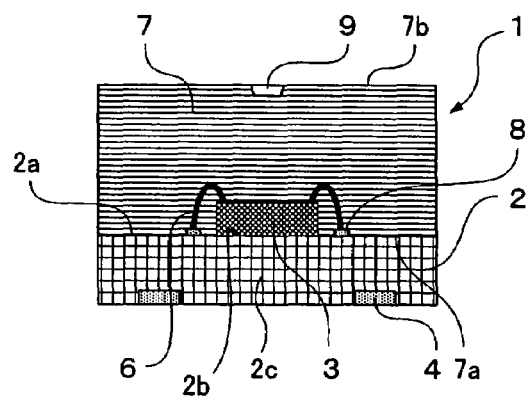
Figure 22C:
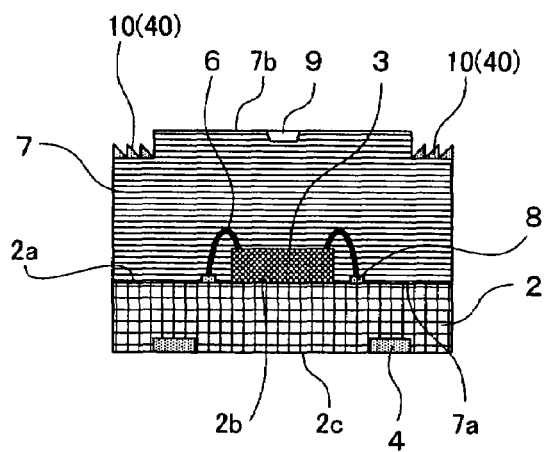
Figure 23A:
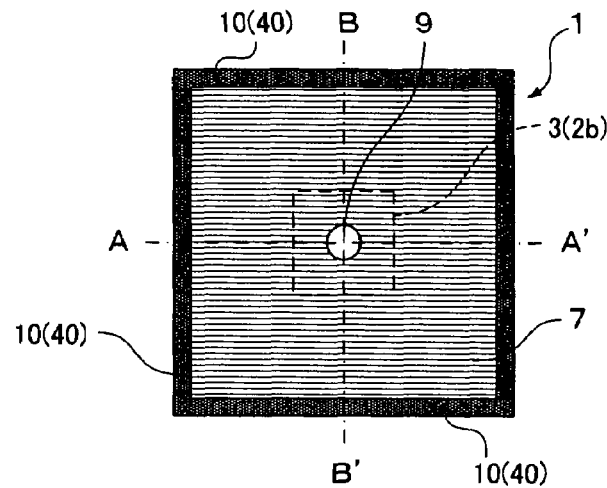
Figure 23B:
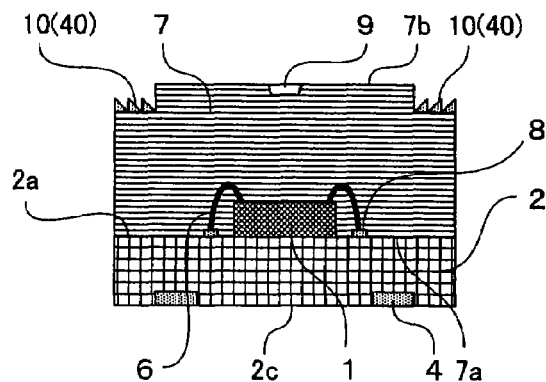
Figure 23C:
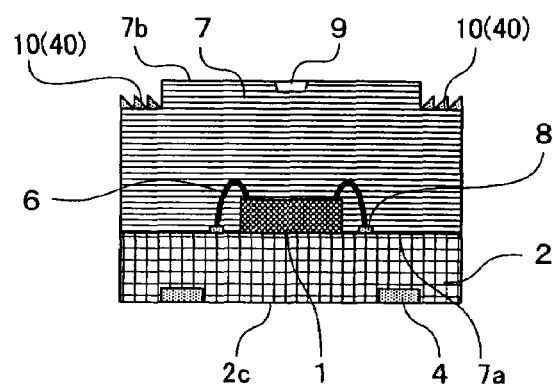
Figure 24A:
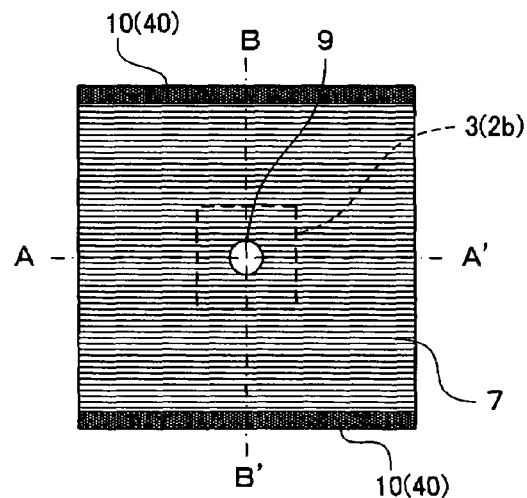
Figure 24B:
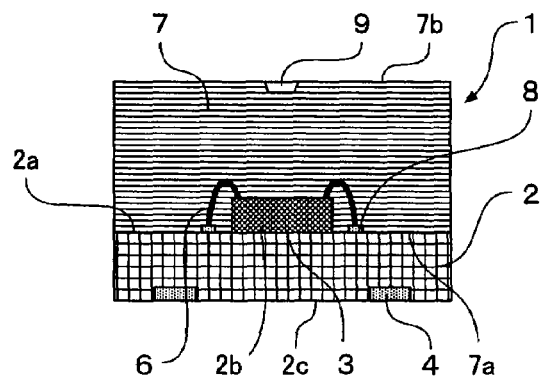
Figure 24C:
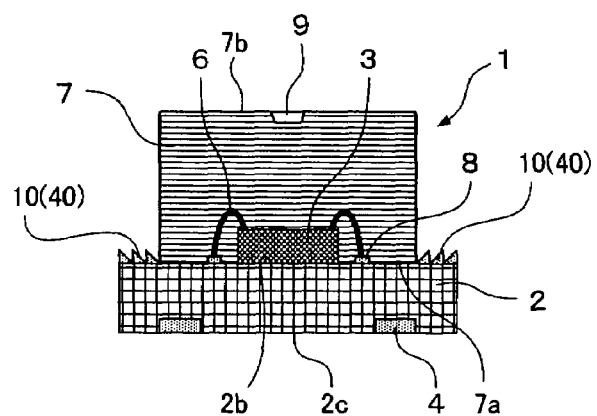
Figure 25A:
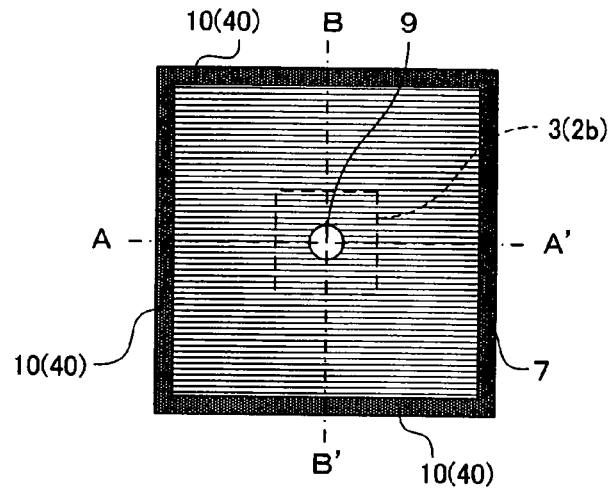
Figure 25B:
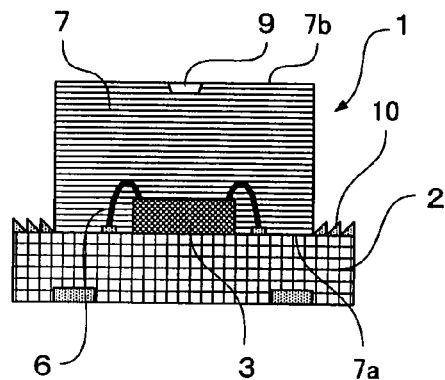
Figure 25C:
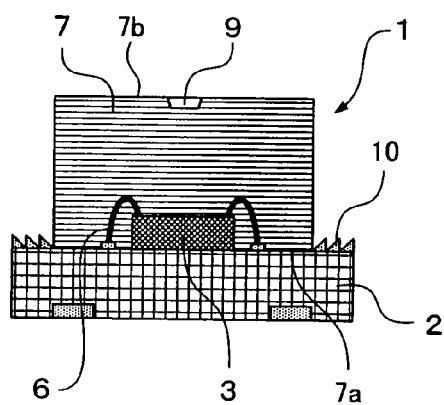

This production equipment is used to perform a resin molding operation and then a dividing operation. Then, as shown in FIGS. 22A to 22C, the resin molding semiconductor device 1 is manufactured which has the air release port impressions 10 present in its areas corresponding to two side portions of the molding resin portion 7, which appears rectangular in a plan view, so that air can be released from the air release port impressions 10 during resin injection. Alternatively, as shown in FIGS. 23A to 23C, the resin molding semiconductor device 1 is manufactured which has the air release port impressions 10 present in its areas corresponding to four side portions of the molding resin portion 7, which appears rectangular in a plan view, so that air can be released from the air release port impressions 10 during resin injection. Additionally, an intermediate mold (not shown) having projecting air release ports 40 at a tip thereof which extend to the vicinity of the substrate 2 allows the manufacturing of the resin molding semiconductor device 1 having the air release port impressions 10 formed in the molding resin portion 7 in the vicinity of the substrate as shown in FIGS. 24A to 24C.

This also enables a sharp reduction in the distance between the resin injection port 29a and the air release port 40. This in turn makes it possible to inhibit air from being mixed in the resin molding portion 7 during resin injection, minimizing the likelihood that an internal void occurs in the resin molding portion 7. Thus, the area of the resin molding portion that can be molded with resin at a time can be increased, allowing productivity to be improved.

In particular, this production equipment provides the simplified linear air release ports 40. This makes it possible to more appropriately clean and maintain the air release ports (air releasing passages) 40, which are likely to be clogged with resin residues.

Further, recessed portions with the air release port impressions 10 are formed in the areas corresponding to the side portions of the molding resin portion 7 in a plan view. This further increases the mechanical strength of the side portions of the molding resin portion 7. This in turn reduces, during a dividing step, the splash of part of the molding resin 25 (package crack), which may occur at the end of cutting with the cutter 17 such as a dicing saw.

FIG. 26A is a plan view showing an assembly of resin molding semiconductor devices 1 manufactured by the production equipment for manufacturing a resin molding semiconductor device in accordance with a seventh embodiment of the present invention. FIG. 26B is a sectional view schematically showing how the assembly of resin molding semiconductor devices 1 is manufactured. As shown in FIGS. 26A and 26B, in the present embodiment, not only the air release ports 40 are formed linearly around the resin injection ports 29 as shown in FIGS. 20A and 20B but the resin injection ports 41 are also shaped like lines with a predetermined length located opposite the top surface portion of the cavity 21.

When the above production equipment manufacturing a resin molding semiconductor device is used for resin molding, the resin is injected into the cavity 21 through the resin injection ports 41 in the form of lines with the predetermined width. The resin flowing into the cavity 21 with the predetermined width discharges air in a wavy form, enabling a further reduction in the occurrence of voids (bubbles).

Figure 27A:
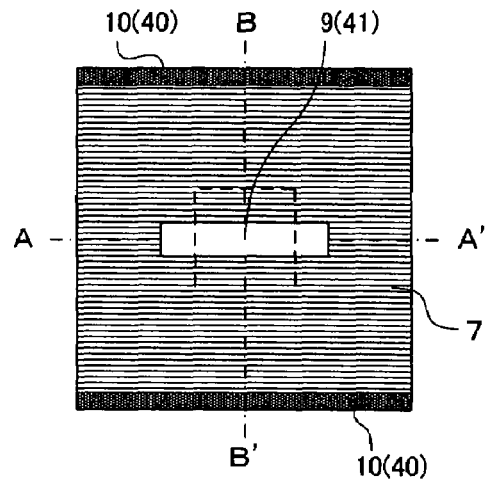
Figure 27B:
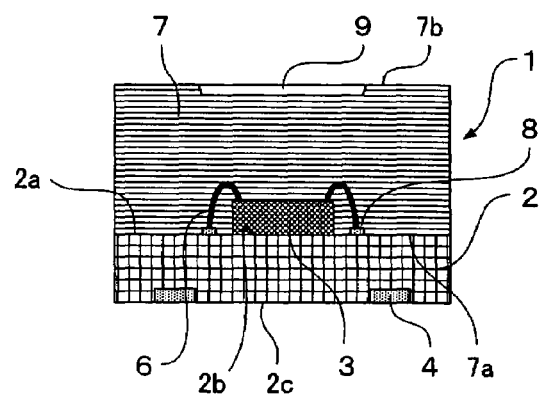
Figure 27C:
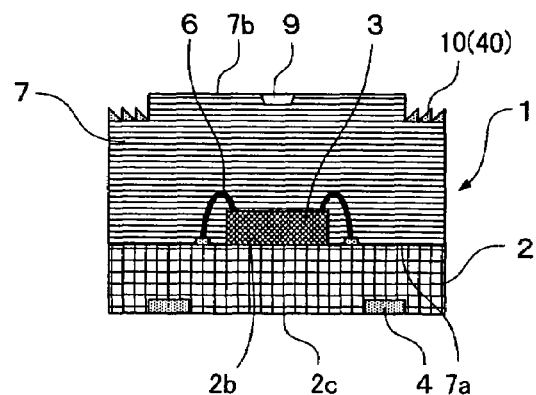
Figure 28A:
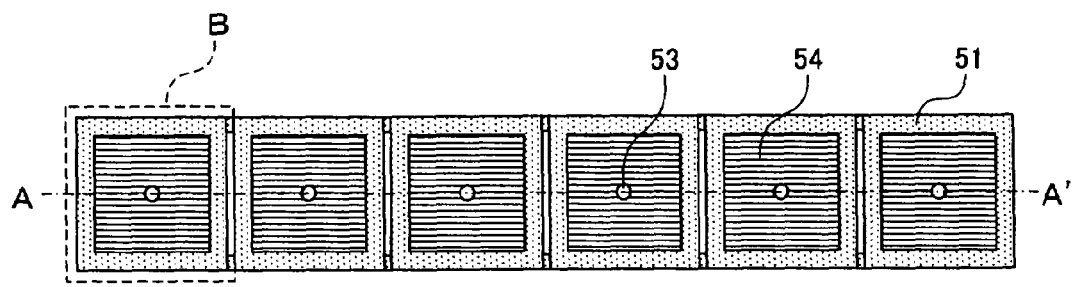
Figure 28B:
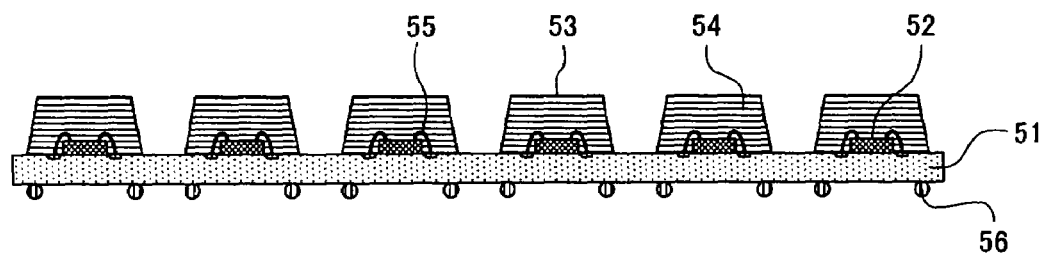
Figure 28C:
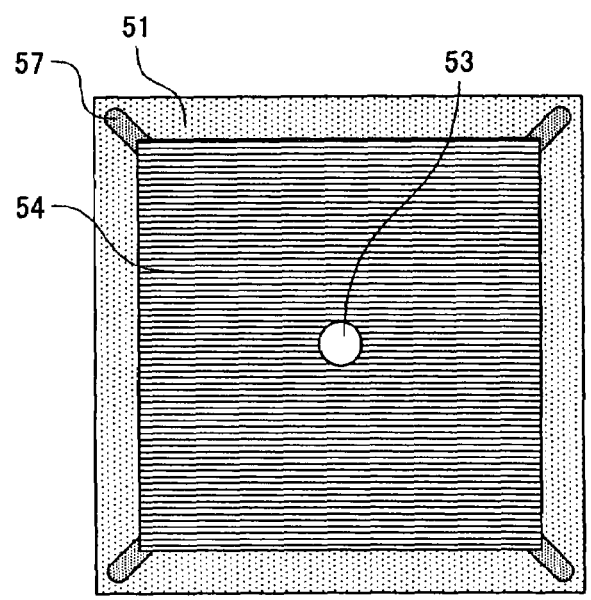
Figure 29:
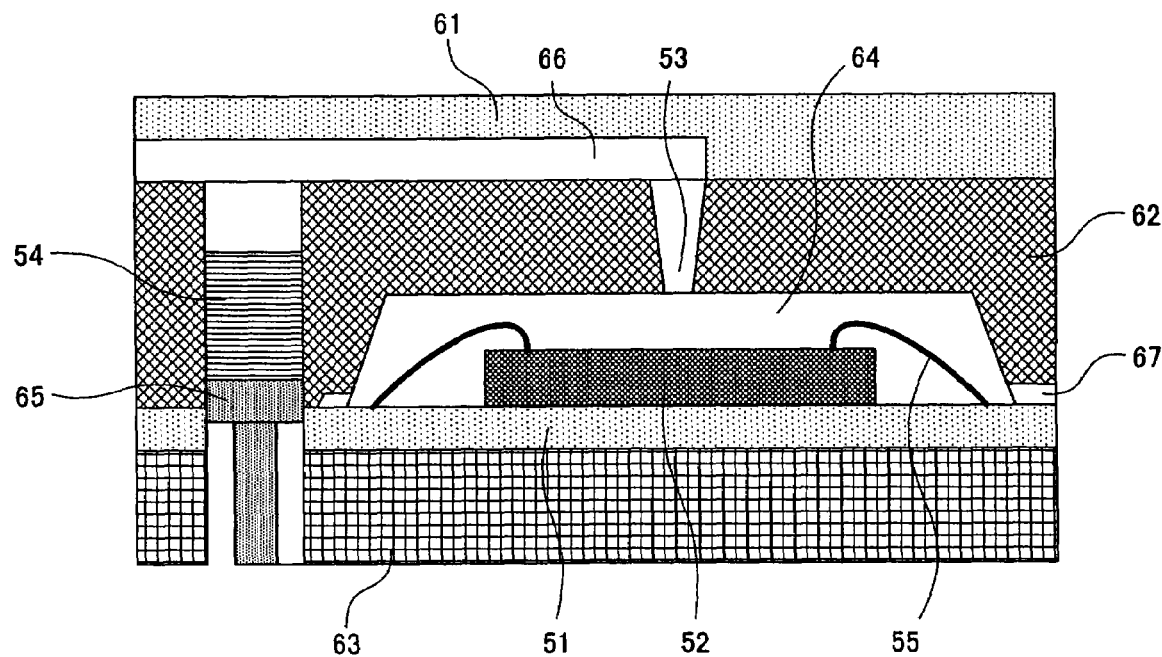
FIG. 29 is a sectional view of the conventional resin molding semiconductor device and a production equipment during a resin molding process.

Further, this production equipment is used to perform a resin molding operation and then a dividing operation. This allows the manufacturing of the resin molding semiconductor device 1 having the resin injection ports 9 appearing rectangular in a plan view and extending by the predetermined length from the central portion of the molding resin portion 7 as shown in FIGS. 27A to 27C.

This also enables a sharp reduction in the distance between the resin injection port 41 and the air release port 40. This in turn makes it possible to inhibit air from being mixed in the resin molding portion 7 during resin injection, minimizing the likelihood that an internal void occurs in the resin molding portion 7. Thus, the area of the resin molding portion that can be molded with resin at a time can be increased, allowing productivity to be improved.

Further, the recessed portions with the air release port impressions 10 and resin injection port impressions 9 are formed in the areas corresponding to the side portions and central portion of the molding resin portion 7 in a plan view. This further increases the mechanical strength of the molding resin portion 7. This in turn reduces, during a dividing step, the splash of part of the molding resin 25 (package crack), which may occur at the end of cutting with the cutter 17 such as a dicing saw.

What is claimed is:

1. A production equipment manufacturing a resin molding semiconductor device including a substrate having a front surface portion with a plurality of chip mounting areas in each of which a semiconductor element is mounted, electrodes each provided on the front surface portion around an outer periphery of the corresponding chip mounting area and electrically connected by a connector to a corresponding electrode provided on the corresponding semiconductor element, a back surface portion, and external terminals provided on the back surface portion, the plurality of semiconductor elements and regions in each of which the electrode on the semiconductor element is connected to the electrode on the substrate being entirely covered with molding resin, the production equipment comprising the substrate placed inside and having the plurality of semiconductor elements mounted thereon, and a resin molding mold having a cavity that is a molding resin injection space, the mold having resin injection ports from which a molding resin is injected into the cavity and air release ports from which air in the cavity is released during resin injection, each of the resin injection ports being formed in a top surface portion of the cavity in the mold in association with the corresponding semiconductor element or a plurality of the semiconductor elements, each of the air release ports being formed in association with the corresponding semiconductor element or a plurality of the semiconductor elements so that the air release ports lie around each of the resin injection ports in a plan view in which the semiconductor device is viewed in a thickness direction of the substrate and the molding resin.

2. The production equipment manufacturing a resin molding semiconductor device according to claim 1, wherein the air release ports are dotted around each of the resin injection ports in a plan view in which the semiconductor device is viewed in the thickness direction of the resin molding portion.

3. The production equipment manufacturing a resin molding semiconductor device according to claim 1, wherein the air release ports are formed linearly around the resin injection ports in a plan view in which the semiconductor device is viewed in the thickness direction of the resin molding portion.

4. The production equipment manufacturing a resin molding semiconductor device according to claim 1, wherein each of the air release ports is formed in an area of the mold which corresponds to the top surface portion of the cavity, in association with the corresponding semiconductor element or a plurality of the semiconductor elements.

5. The production equipment manufacturing a resin molding semiconductor device according to claim 1, wherein each of the air release ports is formed in an area of the mold which corresponds to the back surface portion of the substrate, in association with the corresponding semiconductor element or a plurality of the semiconductor elements.

6. The production equipment manufacturing a resin molding semiconductor device according to claim 2, wherein the mold has an air discharge path connected to the air release ports, a tip portion of the air discharge path is open in the cavity top surface portion of the mold, and the mold has a cylindrical pin having an air releasing passage and an air release port both connected to the air discharge path, the cylindrical pin serving as an auxiliary intermediate mold, the cylindrical pin extending from the cavity top surface portion of the mold toward the front surface portion of the substrate.

7. The production equipment manufacturing a resin molding semiconductor device according to claim 6, wherein the pin has a draft angle formed on an outer peripheral surface thereof so that a cross section in the outer peripheral surface decreases as the pin approaches a tip thereof, to allow the pin to be easily removed after a resin molding process.

8. The production equipment manufacturing a resin molding semiconductor device according to claim 6, wherein the pin has an air releasing passage extending along an axial direction and a through-hole which is formed in the outer peripheral surface of the pin as an air release port and which connects to the air releasing passage in an inner portion thereof.

9. A production equipment manufacturing a resin molding semiconductor device including a substrate having a front surface portion with a plurality of chip mounting areas in each of which a semiconductor element is mounted, electrodes each provided on the front surface portion around an outer periphery of the corresponding chip mounting area and electrically connected by a connector to a corresponding electrode provided on the corresponding semiconductor element, a back surface portion, and external terminals provided on the back surface portion, the resin molding semiconductor device being obtained by entirely molding the plurality of semiconductor elements, the plurality of chip mounting areas and the electrodes on the front surface portion of the substrate, and the connectors with molding resin and dividing the molded substrate and molding resin portion into pieces along dividing lines, the production equipment comprising the substrate placed inside and having the plurality of semiconductor elements mounted thereon, and a resin molding mold having a cavity that is a molding resin injection space, the mold having resin injection ports from which a molding resin is injected into the cavity and air release ports from which air in the cavity is released during resin injection, each of the resin injection ports being formed in a top surface portion of the cavity in the mold in association with the corresponding semiconductor element or a plurality of the semiconductor elements, each of the air release ports being formed so that the air release ports lie around each of the resin injection ports, while overlapping the dividing lines, in a plan view in which the semiconductor device is viewed in a thickness direction of the substrate and the molding resin portion.

10. The production equipment manufacturing a resin molding semiconductor device according to claim 7, wherein each of the air release ports is sized to fit within the width of the dividing line.

11. The production equipment manufacturing a resin molding semiconductor device according to claim 9, wherein the resin injection ports are formed so as to overlap the dividing lines along which the substrate and the molding resin portion are divided into pieces when viewed planarity along the thickness direction of the molding resin portion.

12. A method for manufacturing a resin molding semiconductor device, the method comprising the steps of:

forming electrodes in a front surface portion of a substrate having a plurality of chip mounting areas in each of which a semiconductor element is mounted, at positions located around an outer periphery of the respective chip mounting areas and forming external terminals on a back surface portion of the substrate in association with the respective chip mounting areas;

mounting each of the semiconductor elements with the electrodes in the corresponding chip mounting area of the substrate;

electrically connecting the electrodes on the substrate to the electrodes on the semiconductor elements via connectors;

molding the plurality of semiconductor elements, the plurality of chip mounting areas and electrodes on the front surface portion of the substrate, and the connectors with a molding resin; and dividing the substrate molded with the resin into pieces, the resin molding comprising disposing the substrate with the plurality of semiconductor elements mounted thereon inside a mold having a cavity that is a molding resin injection space, and injecting the molding resin into the cavity through resin injection ports each formed, in association with the corresponding semiconductor element or a plurality of the semiconductor elements, in a cavity top surface portion of the mold which is located opposite the front surface portion of the substrate, to mold the plurality of semiconductor elements, the plurality of chip mounting areas and electrodes on the front surface portion of the substrate, and the connectors with the molding resin for batch molding, while releasing air from air release ports each formed in association with the corresponding semiconductor element or a plurality of the semiconductor elements so that the air release ports lie around each of the resin injection ports in a plan view in which the semiconductor device is viewed in a thickness direction of the molding resin portion.

13. A resin molding semiconductor device comprising:

a substrate, a chip mounting area on a front surface portion of the substrate in which a semiconductor element is mounted, an electrode disposed around an outer periphery of the chip mounting area, and an external terminal on a back surface portion of the substrate, the semiconductor element with the electrode being mounted in the chip mounting area of the substrate;

the electrode on the substrate being electrically connected to the electrode on the semiconductor element via a connector, the semiconductor element, the chip mounting area and electrode on the front surface portion of the substrate, and the connector being covered with a molding resin portion, wherein a resin injection port impression with an uneven shape with the molding resin injected therein is present in a top surface portion of the molding resin portion which is located opposite a bottom surface portion of the molding resin portion which contacts the front surface portion of the substrate, and an air release port impression with a recessed and projecting shape from which air is released during resin injection is present in the top surface portion of the molding resin portion or in a recessed portion of the top surface portion.

14. The resin molding semiconductor device according to claim 13, wherein the recessed portion of the top surface portion is exposed from a side surface of the molding resin portion.

15. The resin molding semiconductor device according to claim 14, wherein the recessed portion of the top surface portion is shaped like an almost quarter circle in a plan view.

16. The resin molding semiconductor device according to claim 13, wherein the side surface portion of the molding resin portion is substantially flush with a side surface portion of the substrate.

* * * * *